(12) United States Patent
Na et al.

(10) Patent No.: US 7,696,745 B2
(45) Date of Patent: Apr. 13, 2010

(54) OPERATING METHOD OF TEST HANDLER

(75) Inventors: Yun Sung Na, Cheunan (KR); In Gu Jeon, Suwon (KR); Dong Hyun Yo, Bucheon-si (KR); Hyun Song, Seoul (KR)

(73) Assignee: TechWing Co., Ltd., Hwaseong-si (KR)

( * ) Notice: Subject to any disclaimer, the term of this patent is extended or adjusted under 35 U.S.C. 154(b) by 195 days.

(21) Appl. No.: 12/051,959

(22) Filed: Mar. 20, 2008

(65) Prior Publication Data

US 2008/0238470 A1    Oct. 2, 2008

(30) Foreign Application Priority Data

Mar. 28, 2007  (KR) ..................... 10-2007-0030581
Apr. 25, 2007  (KR) ..................... 10-2007-0040537

(51) Int. Cl.
*G01R 31/28* (2006.01)

(52) U.S. Cl. .................................. 324/158.1

(58) Field of Classification Search ................. 324/760, 324/765, 758, 158.1, 754, 761–762; 414/17, 414/217, 907
See application file for complete search history.

(56) References Cited

U.S. PATENT DOCUMENTS

| 6,456,062 B2 * | 9/2002 | Yamashita et al. ........ 324/158.1 |
| 6,590,383 B2 * | 7/2003 | Yamashita et al. ........ 324/158.1 |
| 7,408,338 B2 * | 8/2008 | Ham et al. ............... 324/158.1 |

* cited by examiner

*Primary Examiner*—Ha Tran T Nguyen
*Assistant Examiner*—Tung X. Nguyen
(74) *Attorney, Agent, or Firm*—Jefferson IP Law, LLP

(57) ABSTRACT

Operation methods of test handler are disclosed. The pick-and-place apparatus picks up semiconductor devices from first loading compartments arrayed in a matrix on a first loading element, moves, and places onto second loading compartments arrayed in a matrix on a second loading element. Pickers of the pick-and-place apparatus pick up the semiconductor devices from the first loading compartments and place them selectively onto a plurality of adjacent odd rows or a plurality of adjacent even rows of the second loading compartments during one operation. The pick-and-place apparatus includes a relatively large number of the pickers, preferably arrayed in a matrix, and thus performs loading and unloading of semiconductor devices at a relatively high speed.

8 Claims, 21 Drawing Sheets

[FIG. 1]
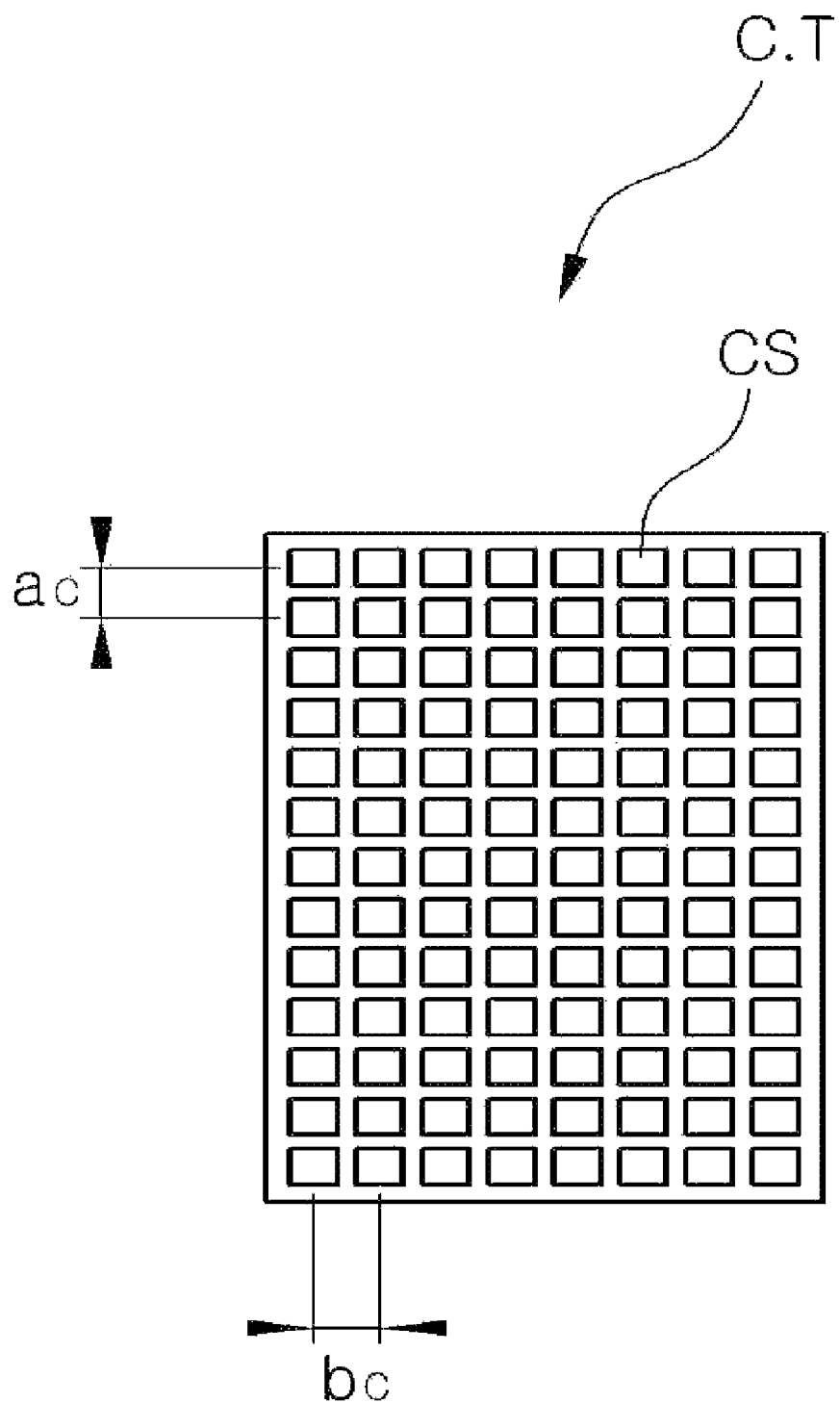

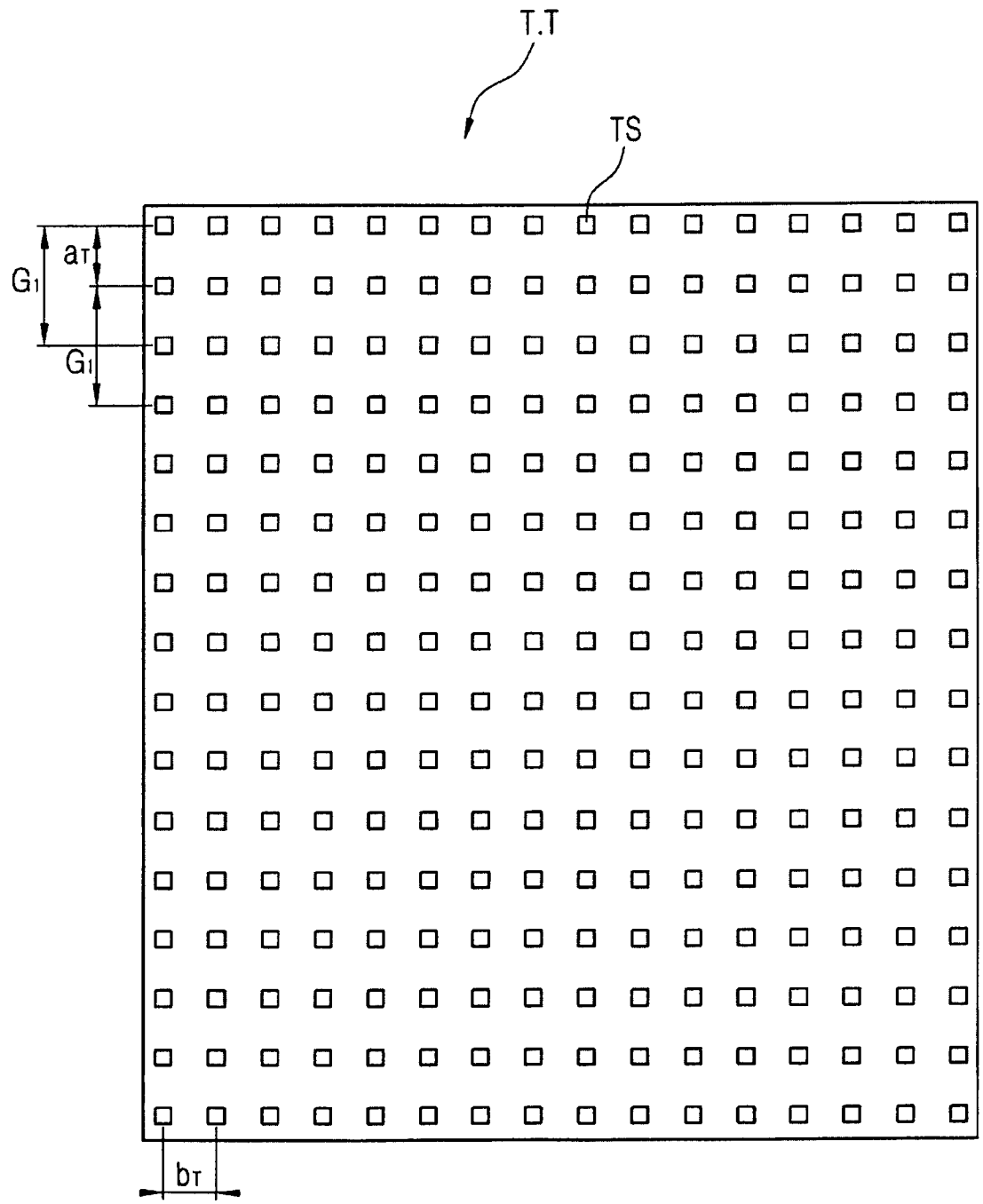
[FIG. 2]

[FIG. 3]
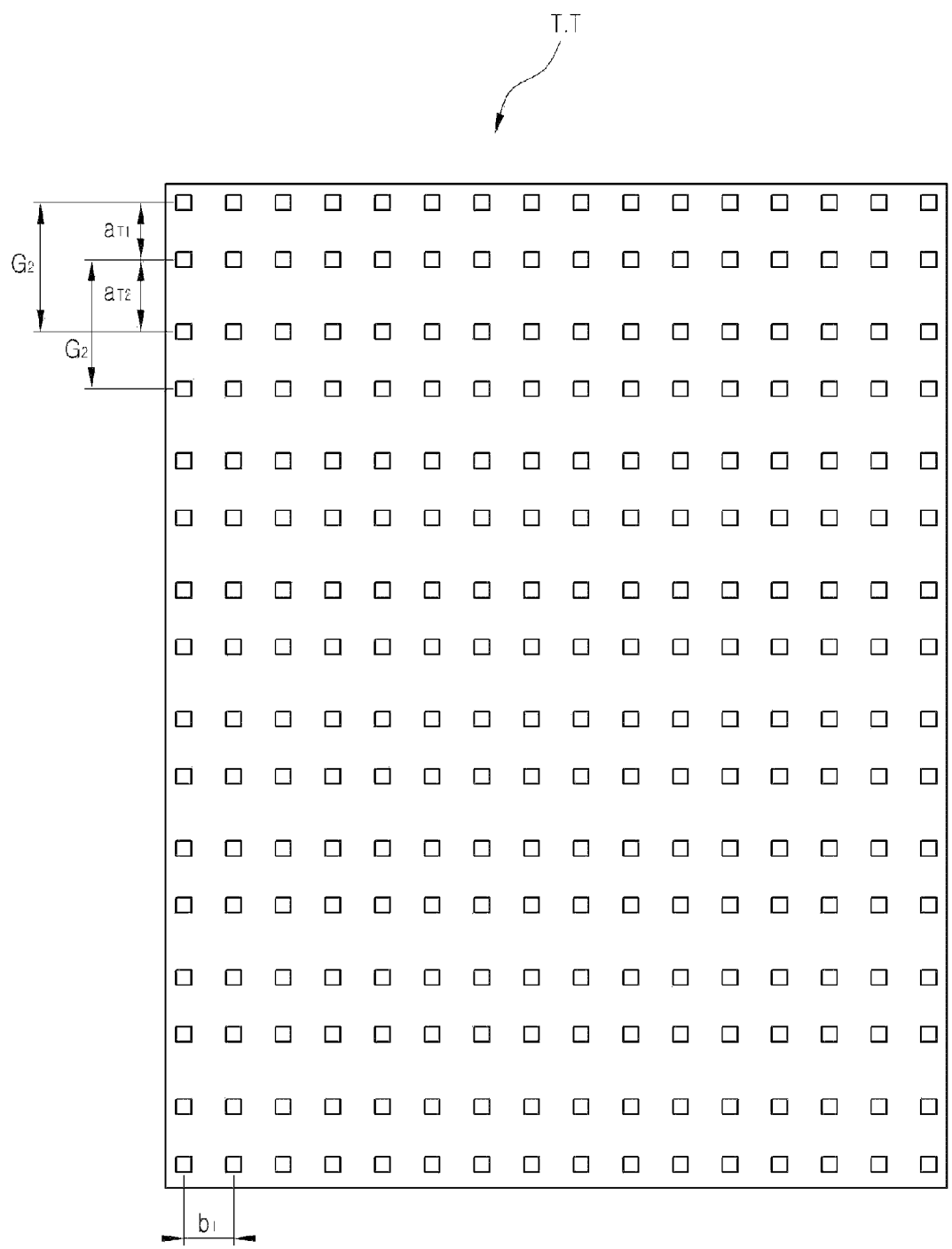

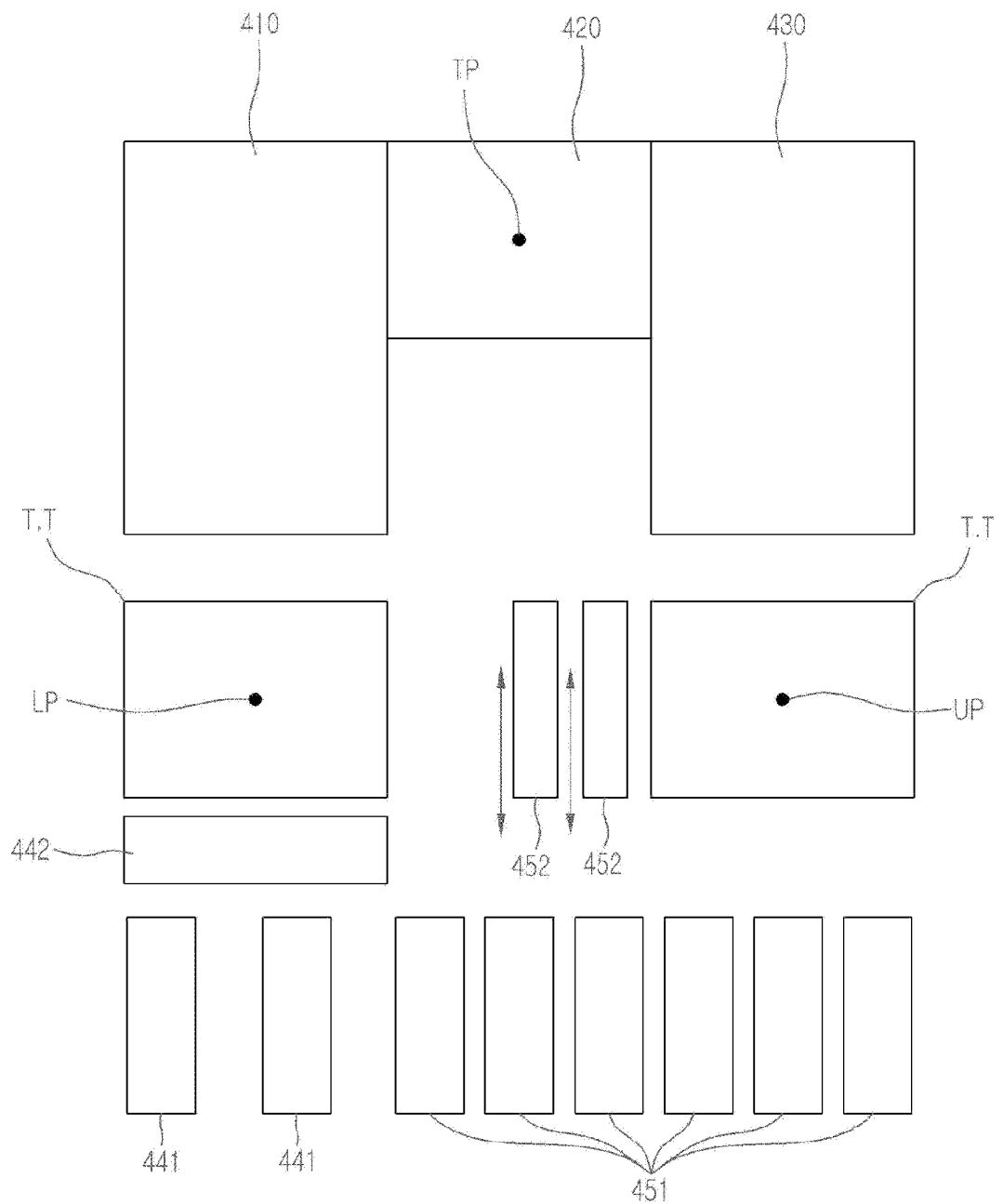
[FIG. 4]

[FIG. 5]
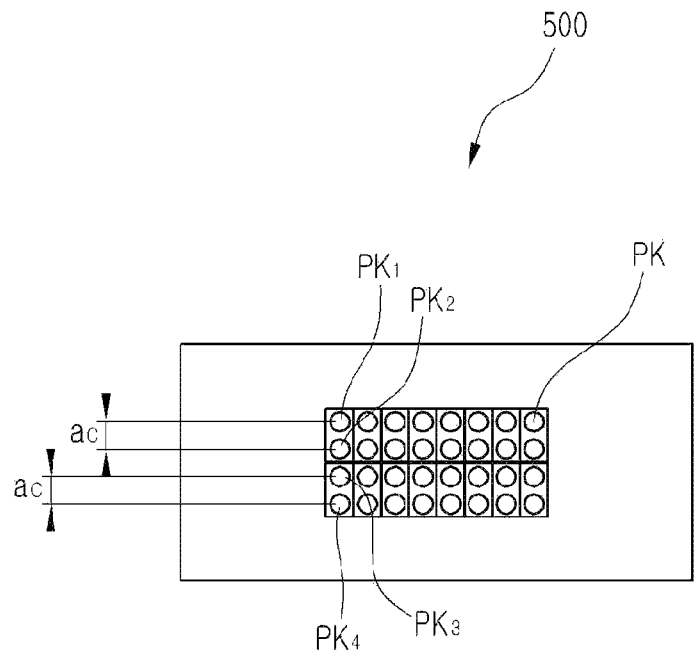
[FIG. 6]
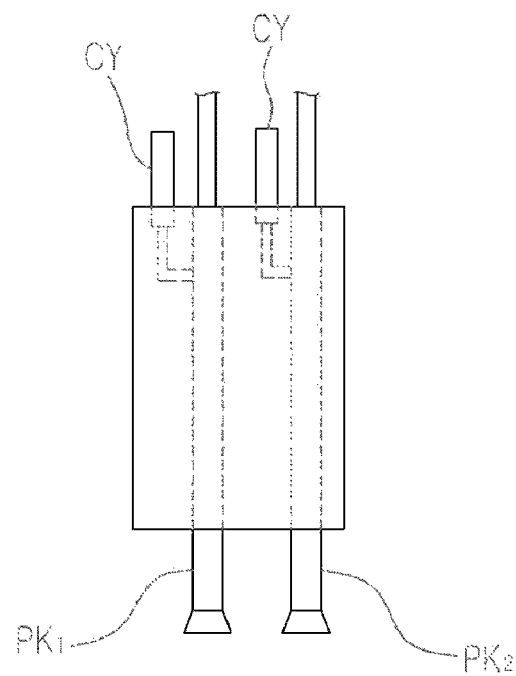

[FIG. 7A]
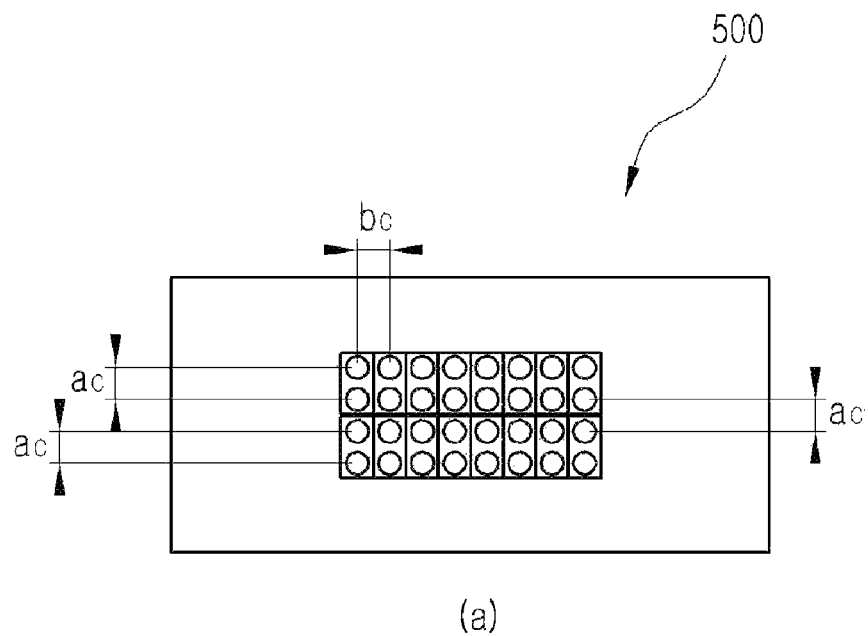
(a)
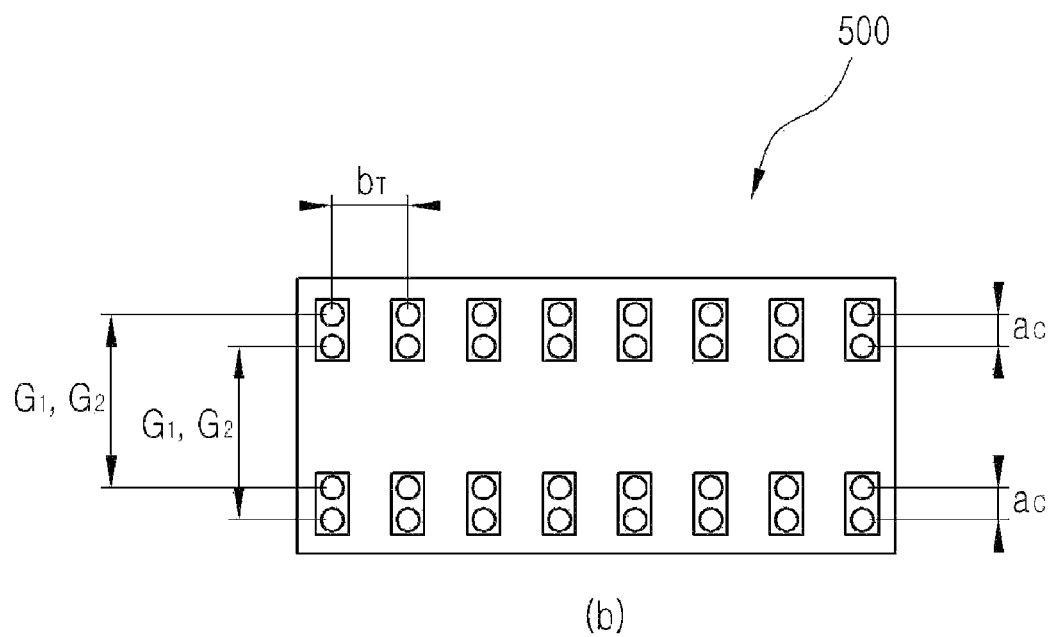
(b)

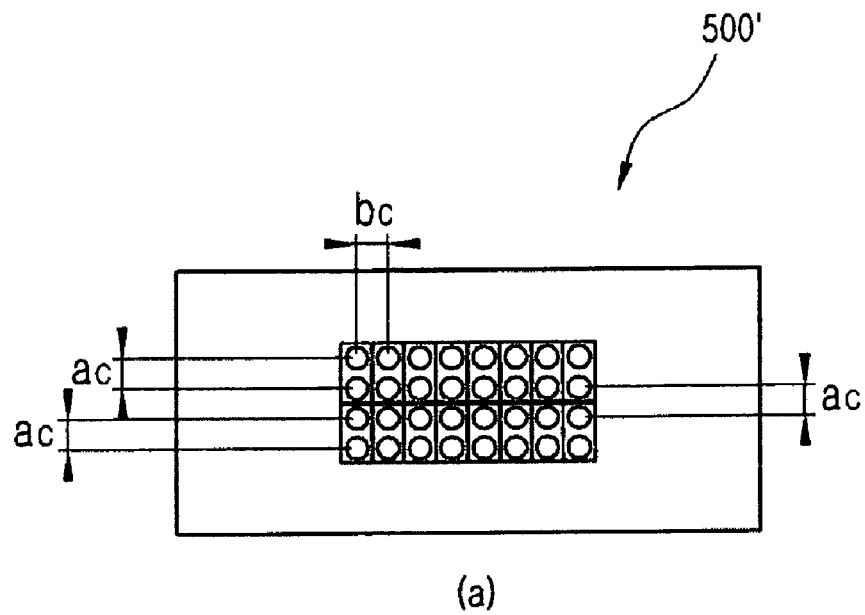
(a)
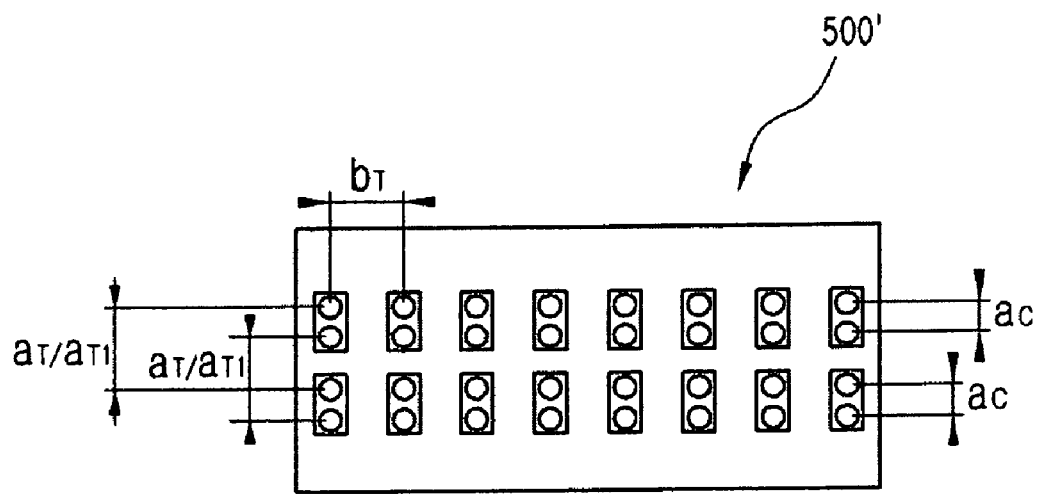
(b)
[FIG. 7B]

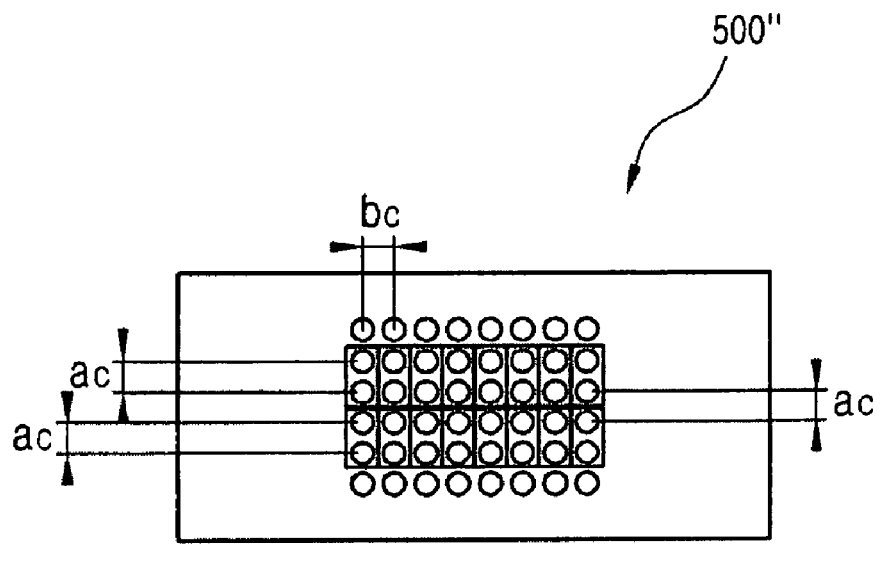
(a)
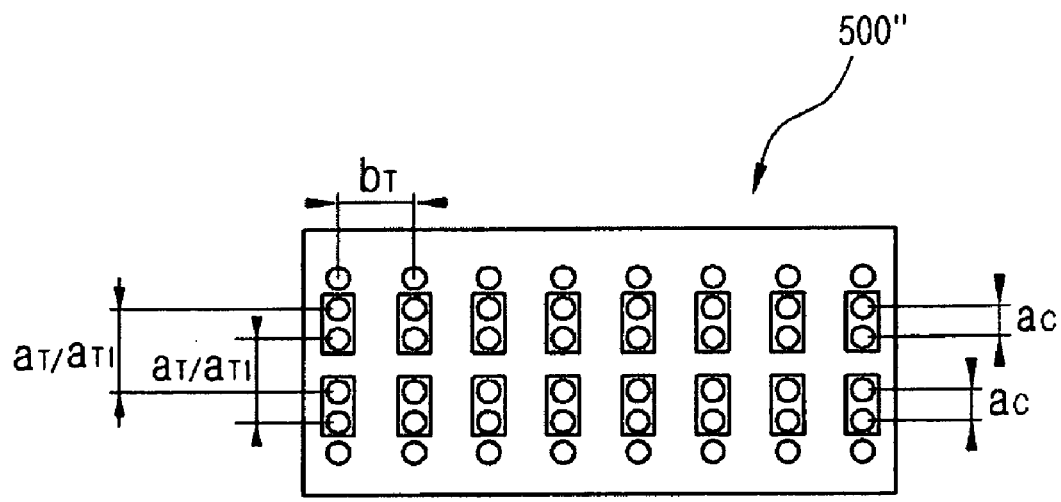
(b)
[FIG. 7C]

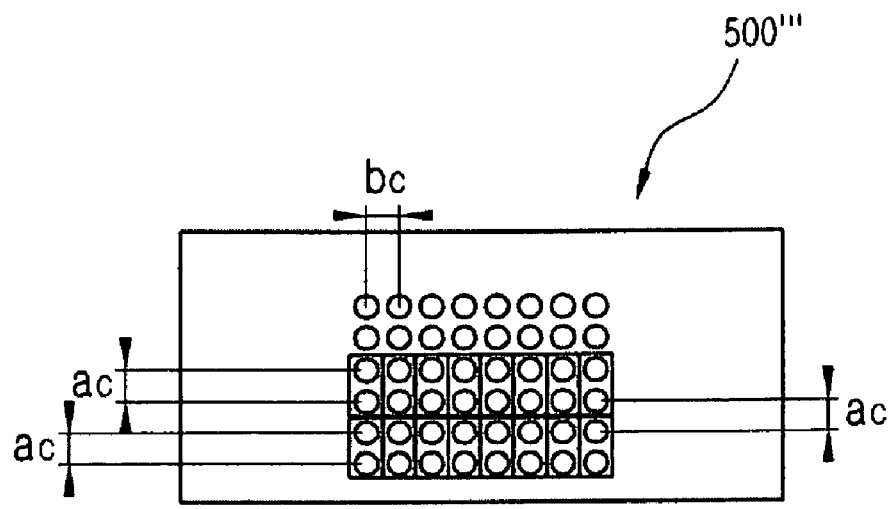
(a)
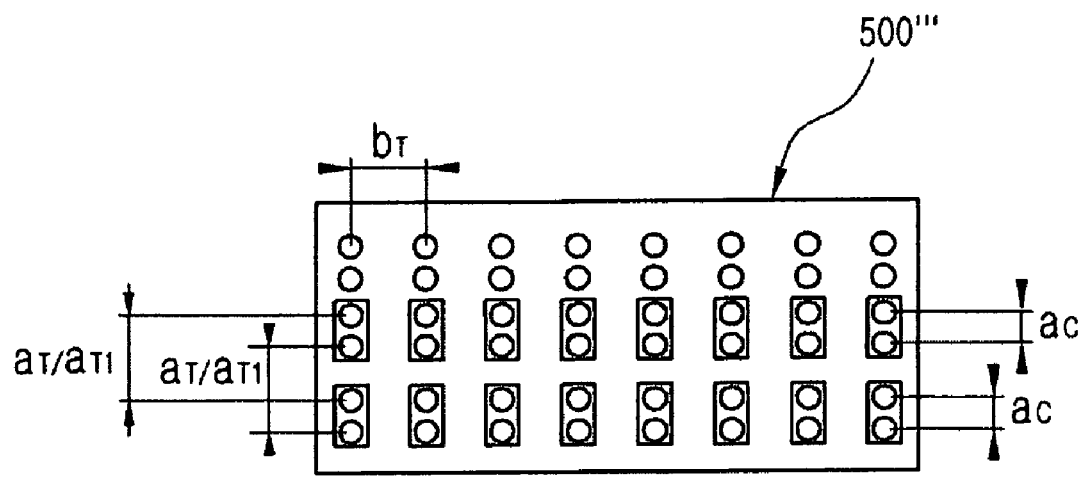
(b)
[FIG. 7D]

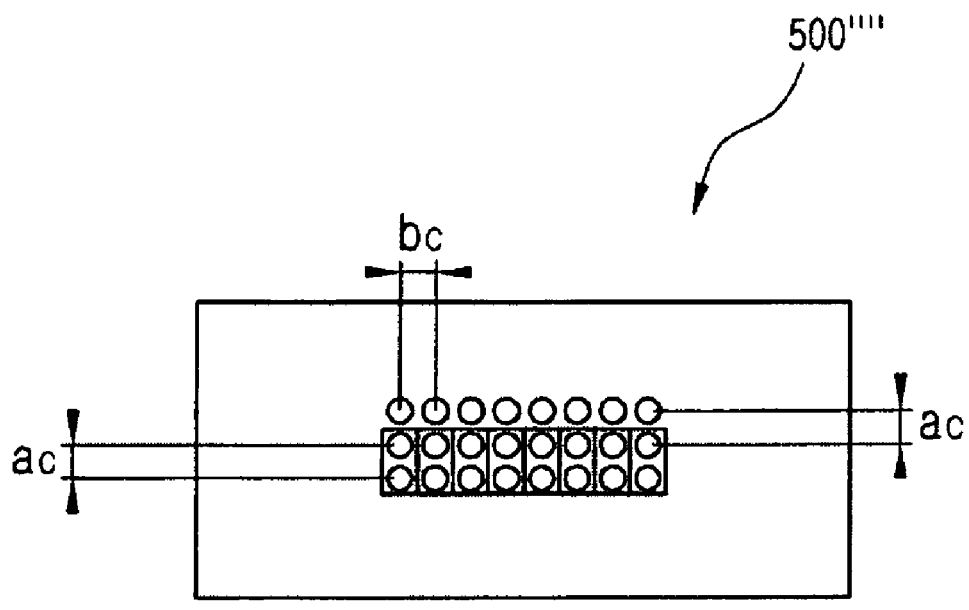
(a)
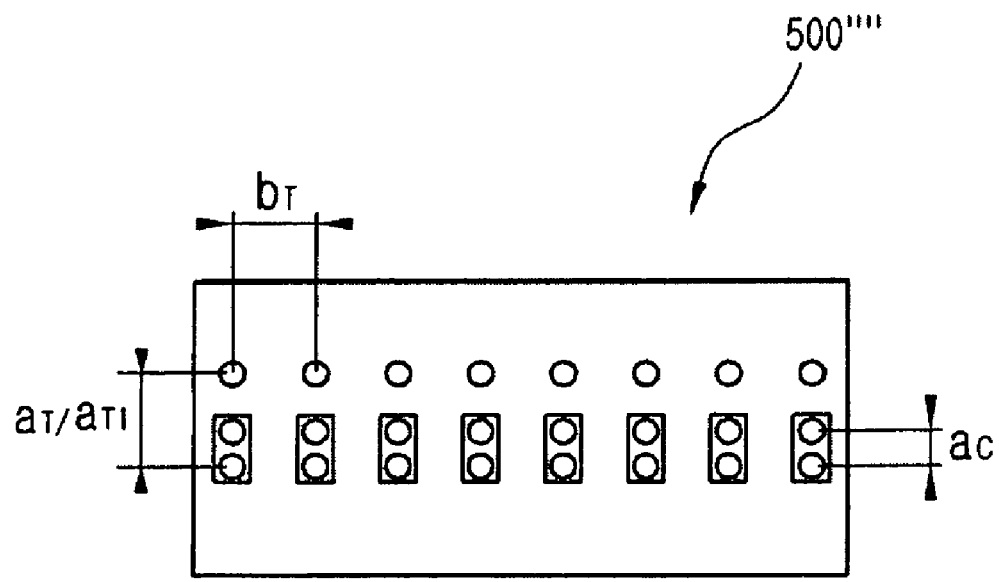
(b)
[FIG. 7E]

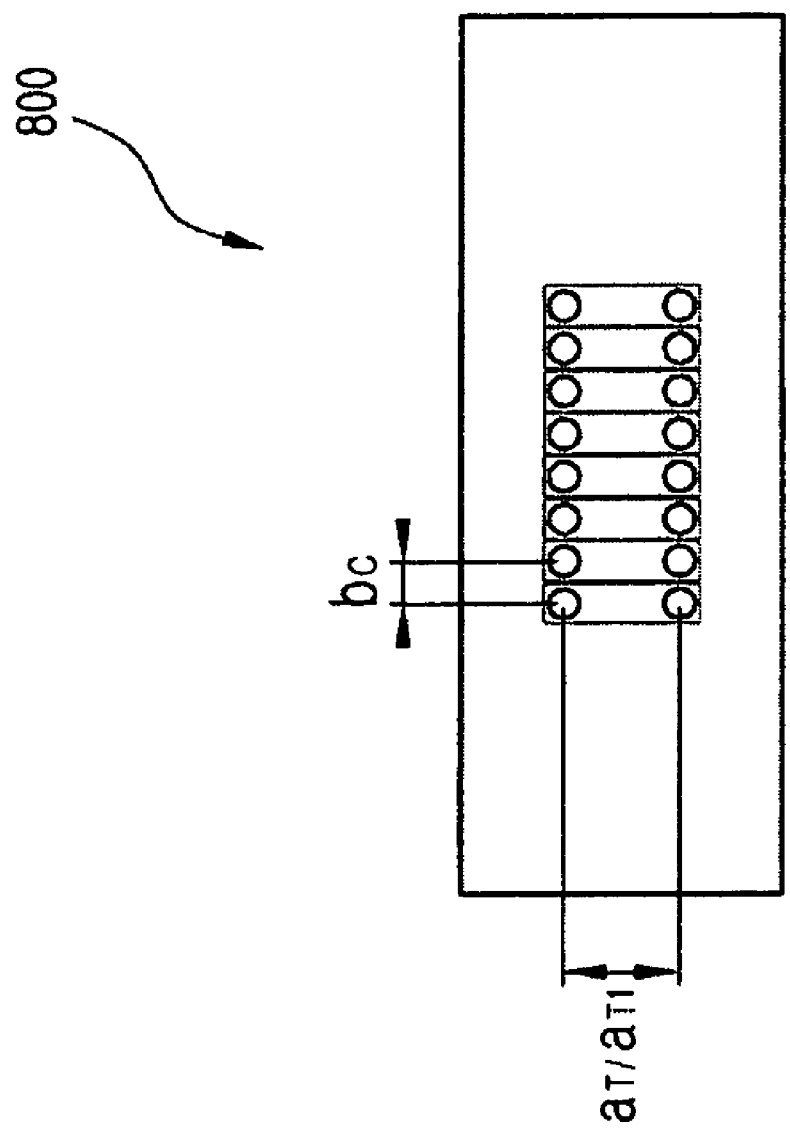
[FIG. 8]

[FIG. 9]
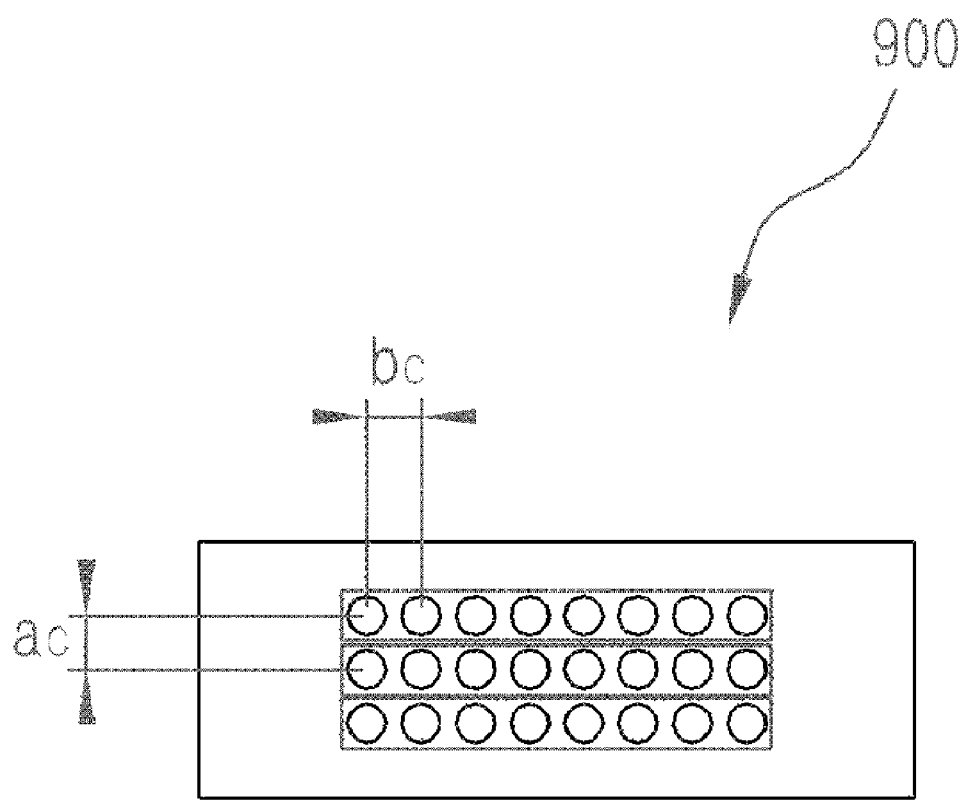

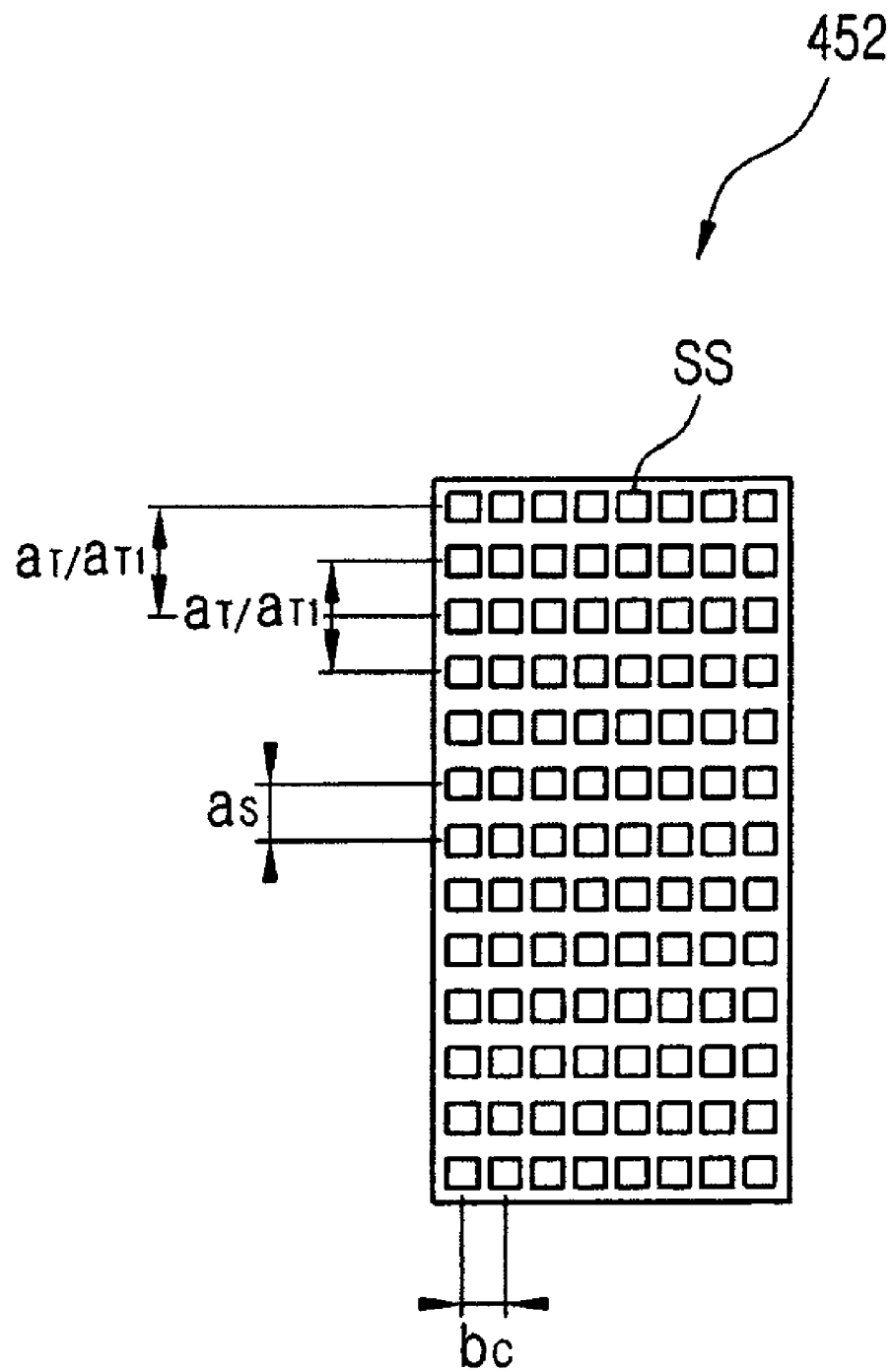
[FIG. 10]

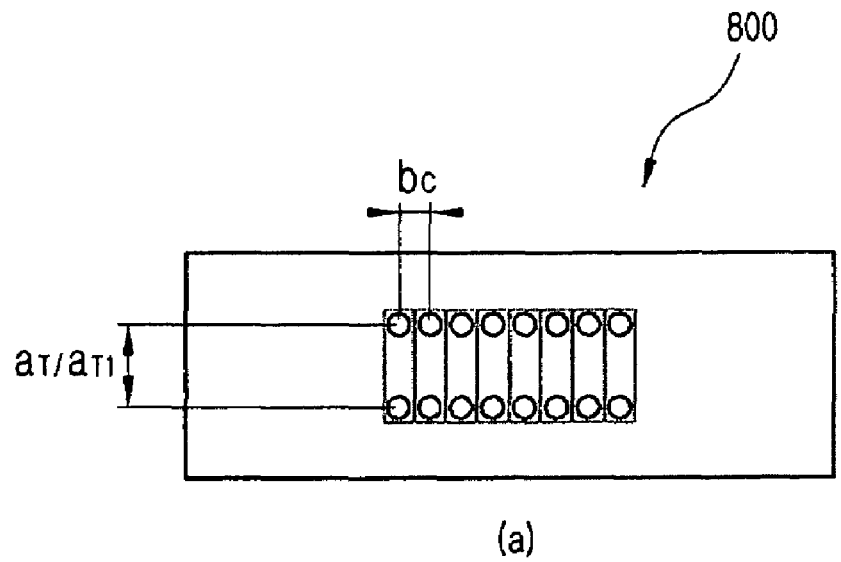
(a)
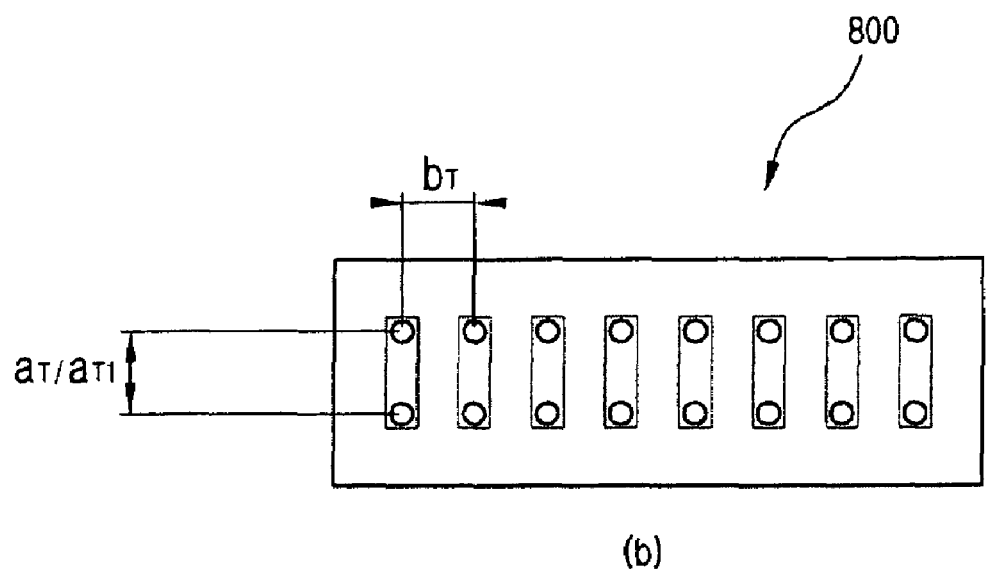
(b)
[FIG. 11]

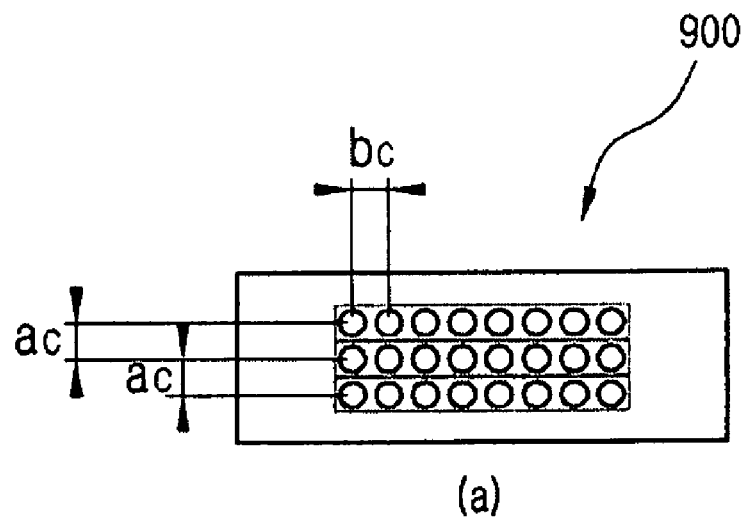
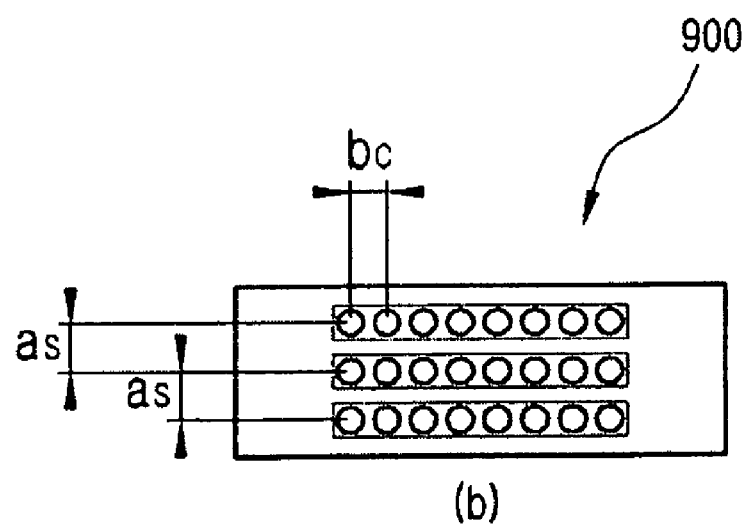
[FIG. 12]

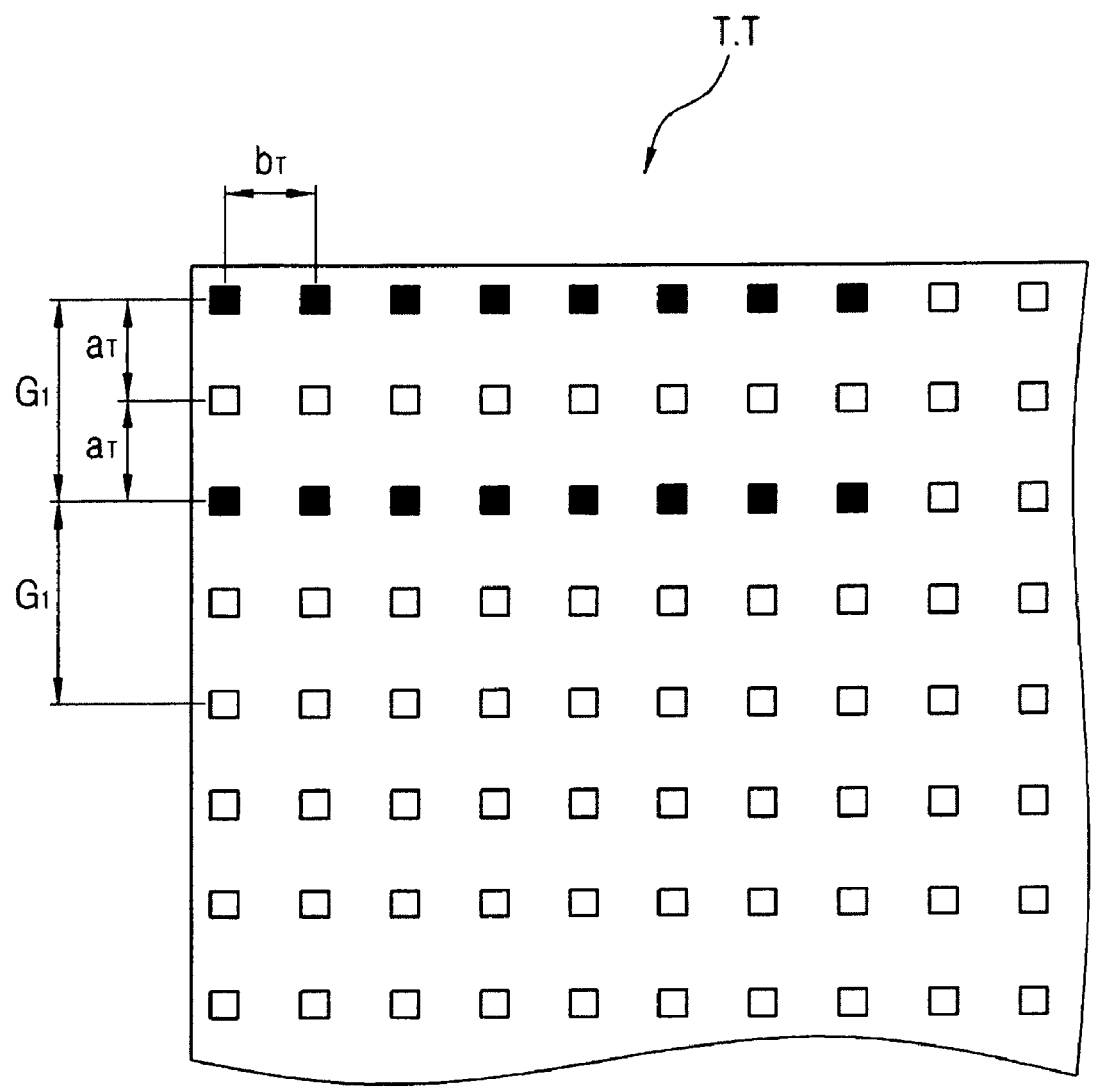
[FIG. 13A]

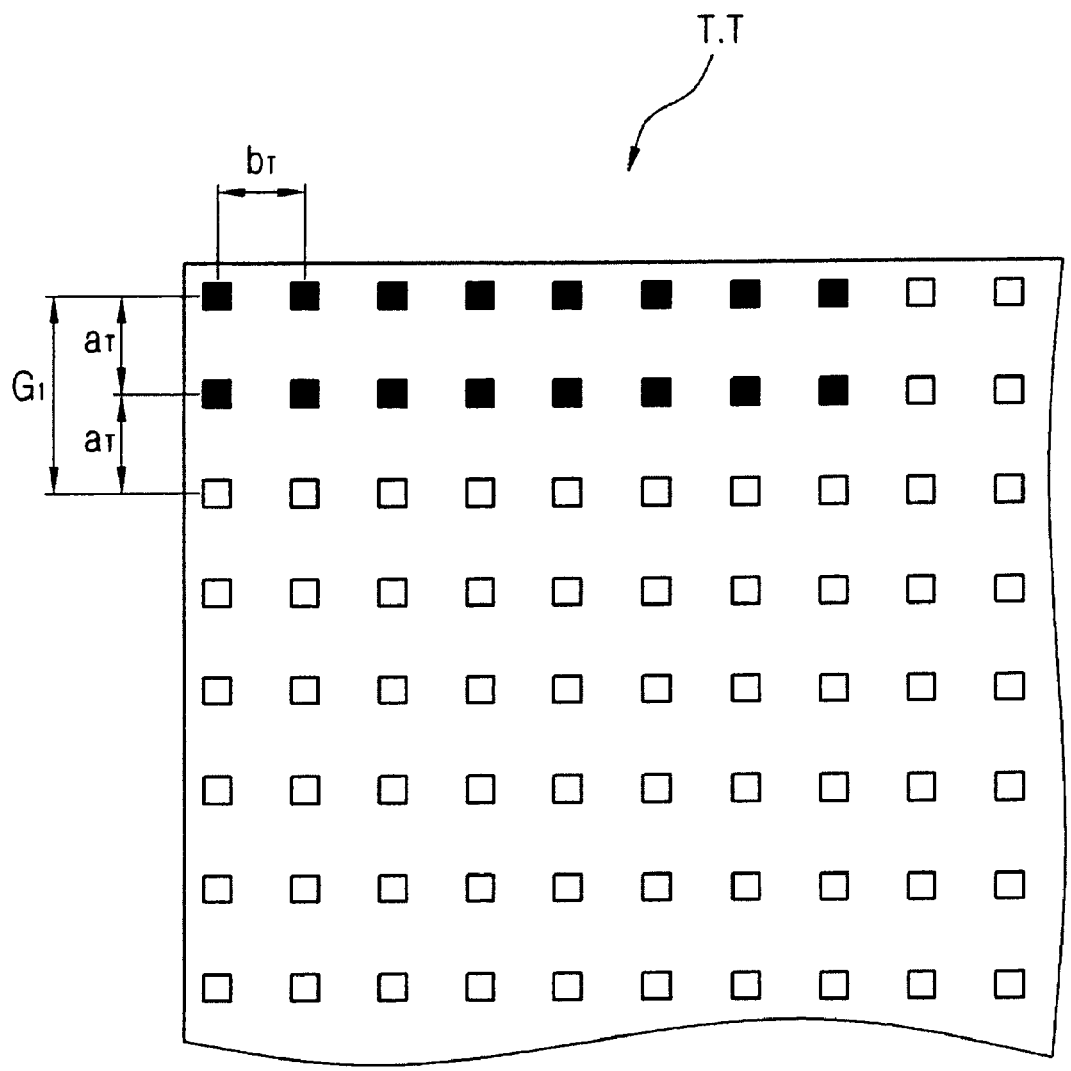
[FIG. 13B]

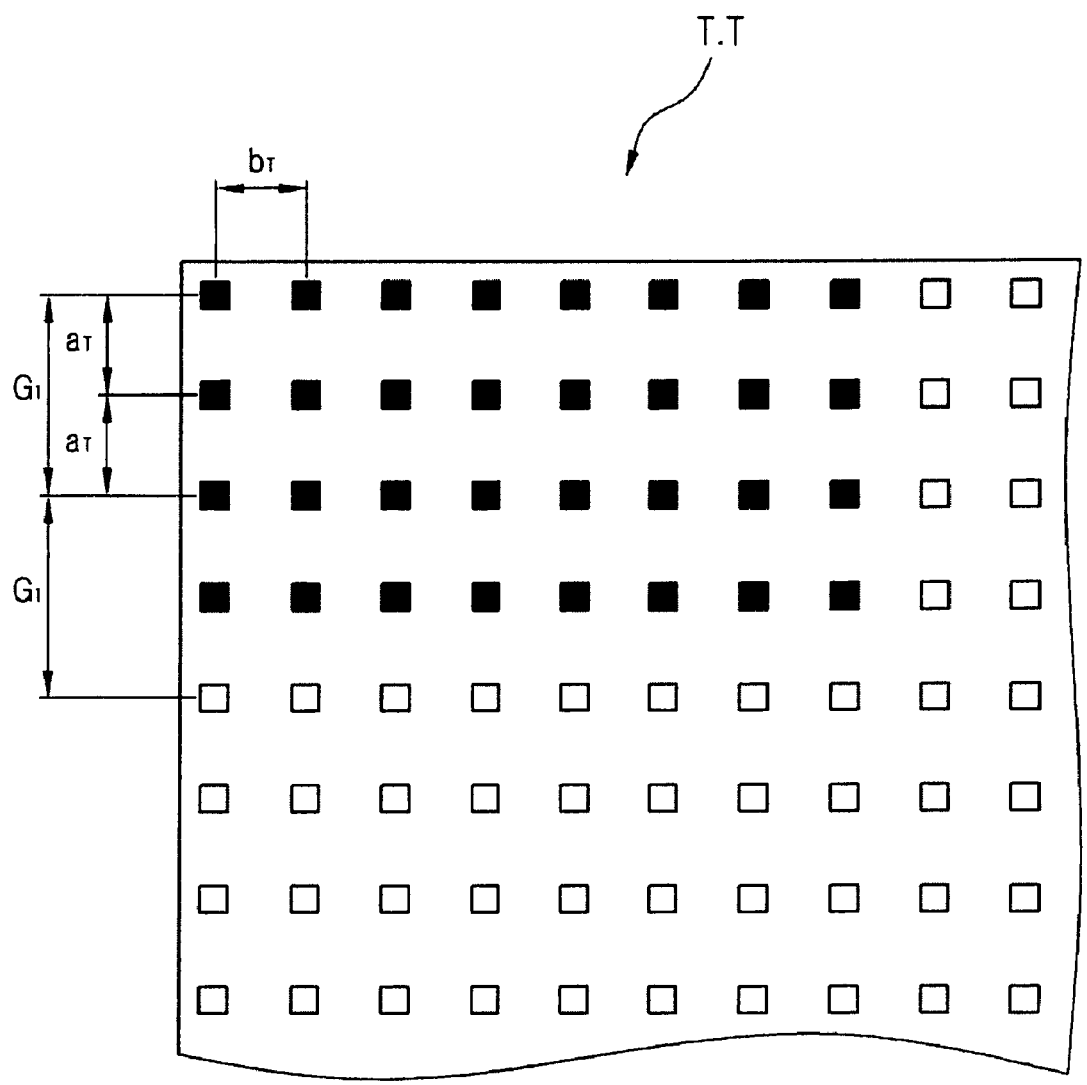
[FIG. 14]

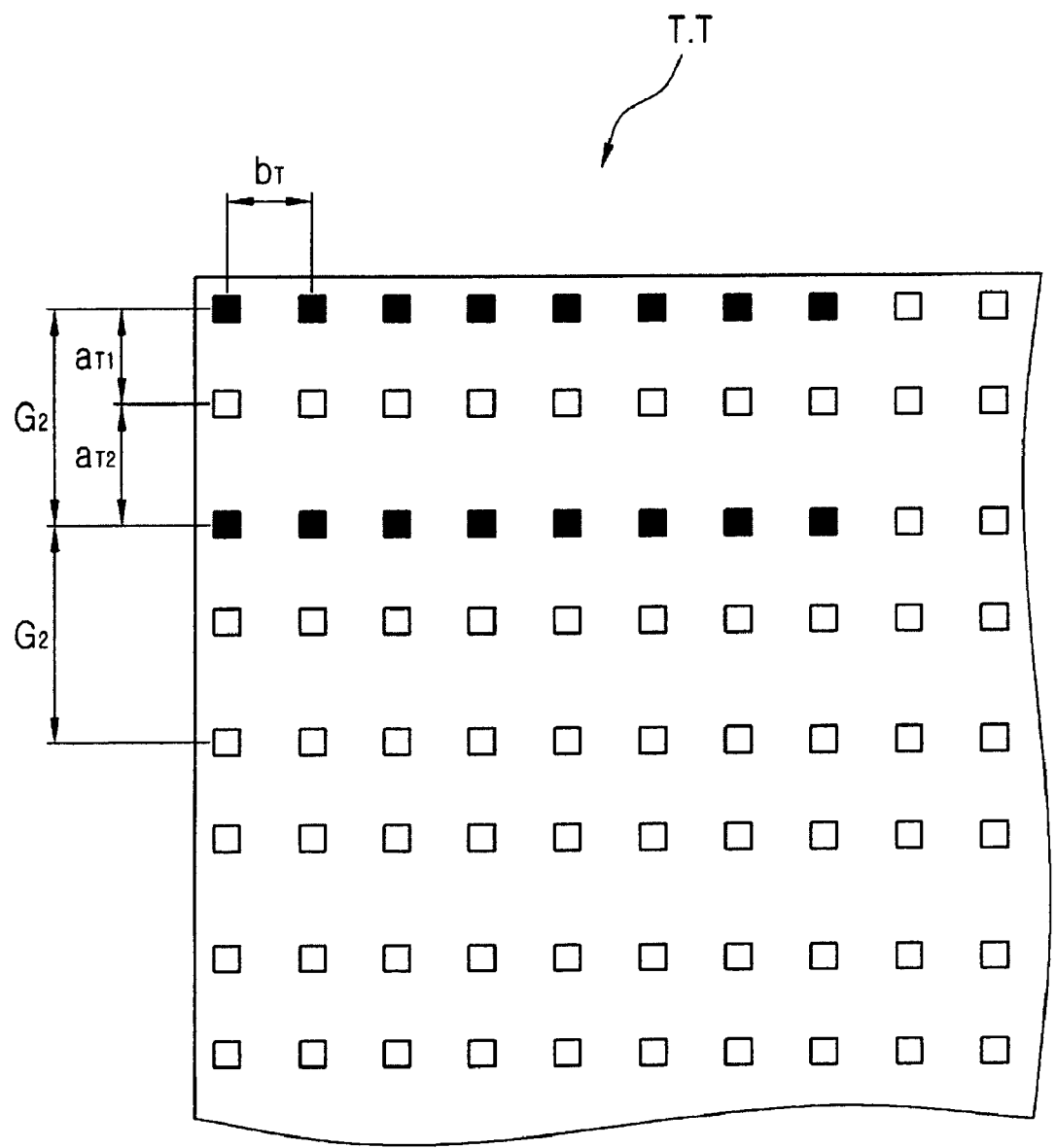
[FIG. 15]

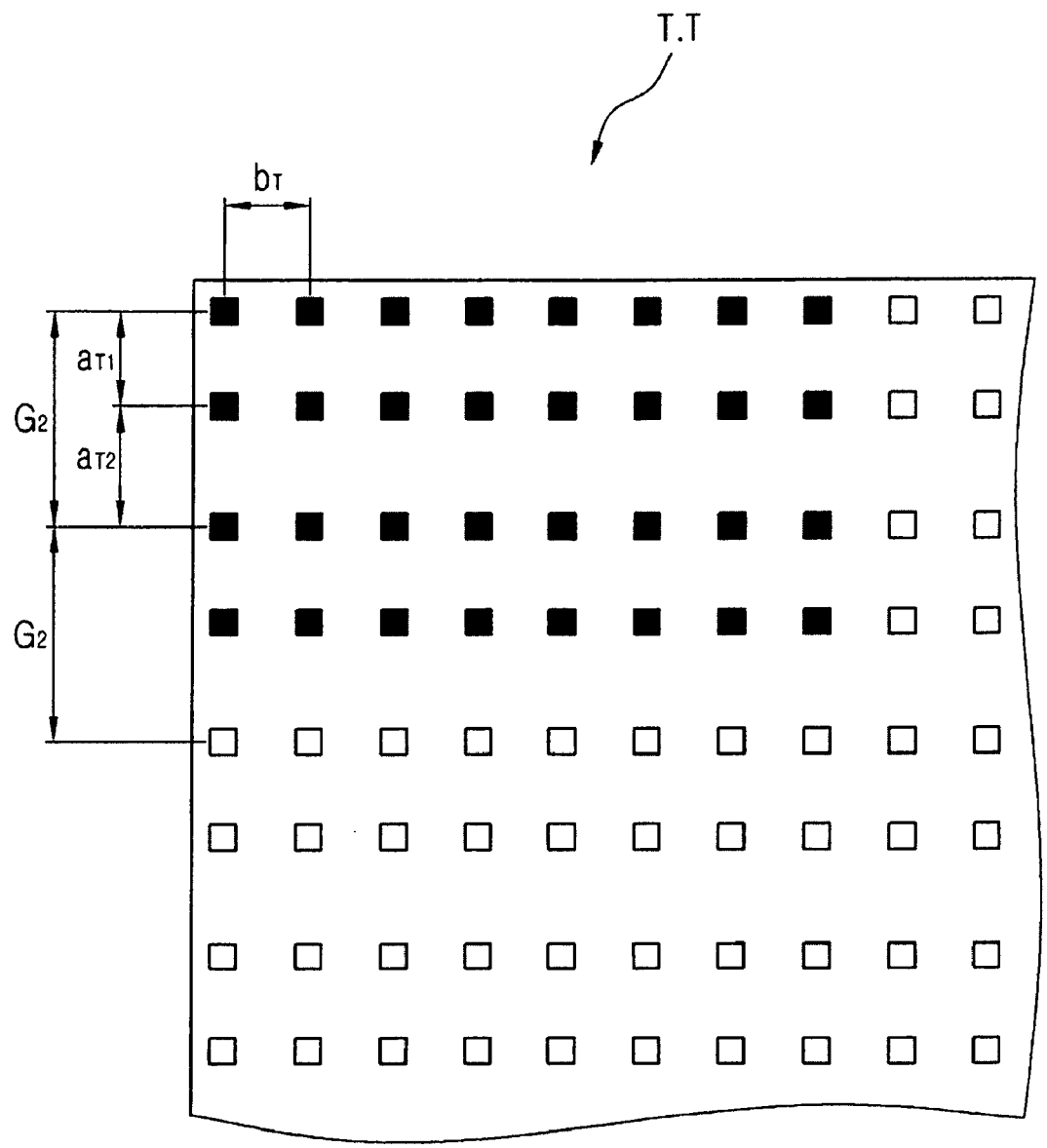
[FIG. 16]

[FIG. 17]
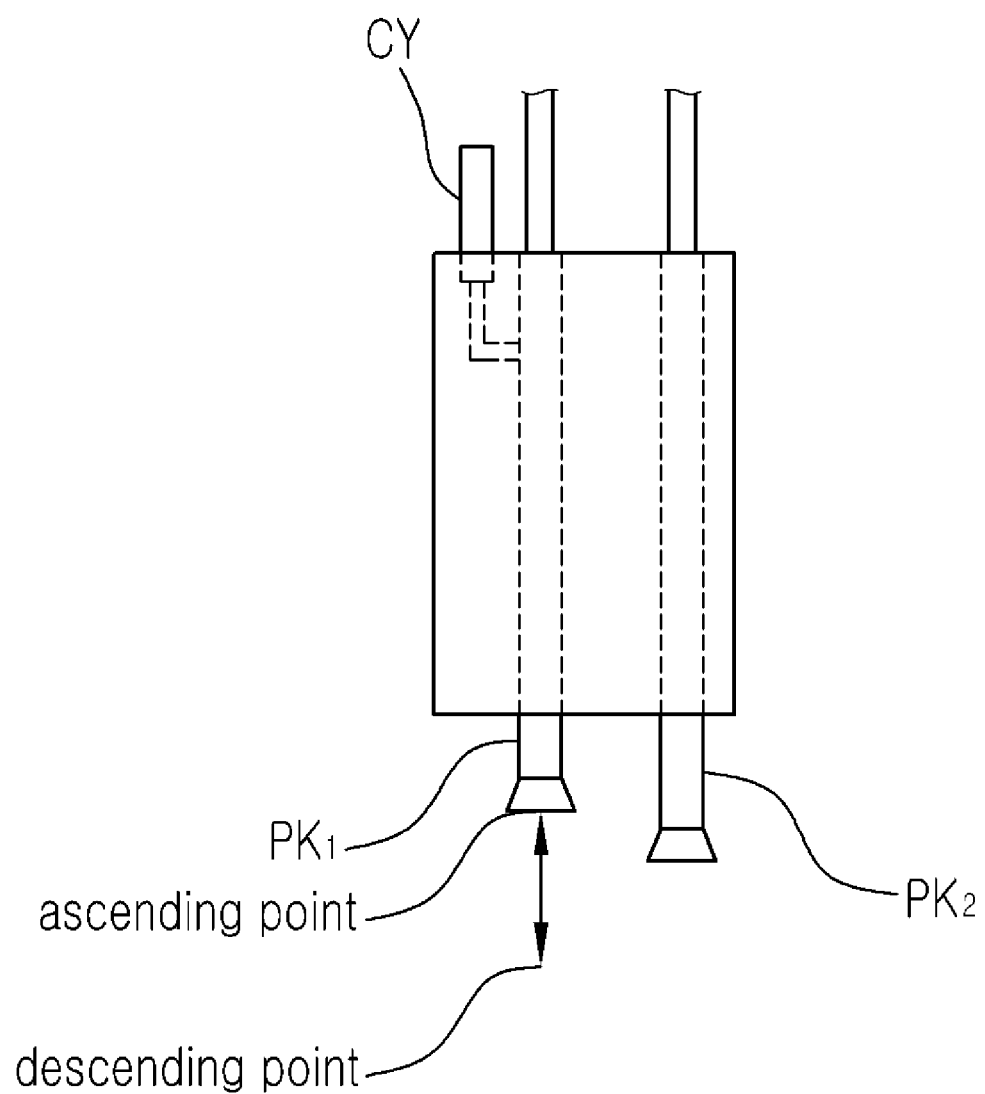

OPERATING METHOD OF TEST HANDLER

PRIORITY

This application claims the benefit under 35 U.S.C. § 119(a) of a Korean patent application filed on Mar. 28, 2007 in the Korean Intellectual Property Office and assigned Serial No. 2007-30581, and a Korean patent application filed on Apr. 25, 2007 and assigned Serial No. 2007-40537, and the entire disclosures of both of which are hereby incorporated by reference.

BACKGROUND OF THE INVENTION

1. Field of the Invention

The present invention relates to loading and unloading methods of a test handler that assists a tester to test the produced semiconductor devices.

2. Description of the Related Art

A test handler is a piece of equipment that loads semiconductor devices manufactured by a certain process onto a test tray, assists a tester to test the semiconductor devices loaded onto the test tray, sorts the semiconductor devices according to the test result, and then unloads the semiconductor devices from the test tray onto customer trays. Technology related to the test handler has been disclosed through many publications, such as a Korean Patent No. 10-0553992 (hereinafter, referred to as a conventional art).

In general, the produced semiconductor devices are loaded onto customer trays and then transferred to the test handler. The semiconductor devices are loaded from customer trays onto a test tray located at a loading position within the test handler. The semiconductor devices loaded onto the test tray are moved through a test position to an unloading position and then unloaded onto customer trays.

While the semiconductor devices are moving within the test handler, they are tested at the test position by a tester docked to the test handler.

FIG. 1 is a schematic plan view illustrating a general customer tray (C.T) and FIG. 2 is a schematic plan view illustrating a general test tray (T.T).

As shown in FIG. 1, the customer tray (C.T) forms a plurality of loading compartments (CS) arrayed in a matrix form. As shown in FIG. 2, the test tray (T.T) also forms a plurality of loading compartments (TS) arrayed in a matrix form. For ease of description, the loading compartments (TS) of the test tray (T.T) are hereinafter referred to as "placing compartments (TS)."

The customer tray (C.T), in general, serves to carry and store semiconductor devices. To this end, the customer tray (C.T) is designed to have a minimized spacing between the loading compartments (CS) in order to load as many semiconductor devices as possible. On the contrary, since the test tray (T.T) serves to assist the tester to test the semiconductor devices, it secures a spacing between the placing compartments (TS) in such a way that the semiconductor devices loaded onto the test tray (T.T) can be tested without interference. Therefore, the inter-row spacing (aC) and the inter-column spacing (bC) between the loading compartments (CS) of the customer tray (C.T) are smaller than the inter-row spacing (aT) and the inter-column spacing (bT) between the placing compartments (TS) of the test tray (T.T), correspondingly and respectively.

The test handler includes a pick-and-place apparatus that loads semiconductor devices from a customer tray (C.T) onto a test tray (T.T) or unloads semiconductor devices from a test tray (T.T) onto a customer tray (C.T). The pick-and-place apparatus is also referred to as a loader hand, unloader hand, loader, or unloader, etc. The pick-and-place apparatus is configured to include a plurality of pickers generally arrayed in a matrix, in which one picker picks up one semiconductor device. Such a configuration of the pick-and-place apparatus makes it possible to transfer as many semiconductor devices as possible during one operation.

To this end, the pick-and-place apparatus must have a pitch regulation apparatus that regulates the pitch between the plurality of pickers to the spacing between the loading compartments (CS) of the customer tray (C.T) or the spacing between the placing compartments (TS) of the test tray (T.T).

If the pickers are arrayed in two rows or columns in the pick-and-place apparatus, the pitches between the two rows or between the two columns of the pickers can be regulated only by cylinder piston units. On the contrary, if the pickers are arrayed in three or more rows or columns, a cam system or a link system must be used to regulate the pitches between the rows or between the columns of the pickers. For reference, the cam system is employed by most of the test handlers produced by MIRAE Company, and the link system is used by most of the test handlers produced by TECHWING Company.

However, both the cam system and the link system cause an increase in the weight of the pick-and-place apparatus. If the pick-and-place apparatus becomes too heavy, its mobility is decreased so that it cannot perform a loading or unloading operation at a high speed. To prevent such a problem, the conventional pick-and-place apparatus is configured in such a way that the pickers are arrayed in a 2×N matrix (N>2), in which the pitches between the columns of the pickers are regulated by a cam system or a link system and the pitches between the rows of the pickers are regulated by cylinder piston units. Through such a configuration, the conventional pick-and-place apparatus achieves the aim of transferring a number of semiconductor devices, during one operation, and also achieves the objective of operating at a high speed.

In addition, the conventional art is implemented by another test tray (T.T) as shown in FIG. 3. The test tray (T.T) is configured in such a way that the placing compartments (TS) can be regularly arrayed in two different inter-row spacings (aT1 and aT2). When the conventional pick-and-place apparatus includes three or more rows of the pickers, the pitches between the respective rows of the pickers must be possible to be regulated from the spacing (ac) between the rows of the loading compartments (CS) of the customer tray (C.T) to the spacings (aT1 and aT2) between the rows of the placing compartments (TS) of the test tray (T.T), or vice versa. However, this configuration makes the pick-and-place apparatus complicated and causes an increase in the number of parts. Therefore, the conventional pick-and-place apparatus cannot be implemented three or more rows.

That is, the conventional pick-and-place apparatus must be configured as a structure of only two rows of the pickers and accordingly cannot perform a loading or unloading operation at a high speed. Therefore, a new method is required to overcome these problems.

SUMMARY OF THE INVENTION

The present invention solves the above problems, and provides loading and unloading methods of a test handler adapted to a pick-and-place apparatus that includes pickers arrayed in three or more rows.

In accordance with an exemplary embodiment of the present invention, the present invention can be accomplished by an operation method of a test handler, the method comprising the steps of (a) loading semiconductor devices from a customer tray located on a loading plate onto a test tray located at a loading position by a loading pick-and-place apparatus having pickers arrayed in an M×N matrix (M is an integer equal to or greater than 4 and N is an integer equal to or greater than 1), in which, in terms of adjacent four rows, a pitch between the 1st and 2nd rows of the pickers and a pitch between the 3rd and 4th rows of the pickers are fixed to be identical to a spacing between rows of loading compartments of the customer tray, (b) assisting a tester to test the semiconductor devices, loaded onto the test tray, at a test position, after moving the test tray to the test position, and (c) unloading the tested semiconductor devices from the test tray located at an unloading position onto another customer tray located on an unloading plate, after moving the test tray to the unloading position.

Here, the step (a) includes the steps of (a1) picking up the semiconductor devices from the customer tray by the pickers, (a2) regulating a pitch between the 2nd and 3rd rows of the pickers so that a pitch between the 1st and 3rd rows of the pickers and a pitch between the 2nd and 4th rows of the pickers are identical to a spacing between rows of placing compartments of the test tray, and (a3) placing the semiconductor devices, picked up by the 1st and 3rd rows of the pickers or the 2nd and 4th rows of the pickers, moving a certain distance, and placing the remaining semiconductor devices, picked up by the 2nd and 4th rows of the pickers or the 1st and 3rd rows of the pickers.

Preferably, the spacing between the rows of the placing compartments of the test tray is an adjacent inter-row spacing between the placing compartments of the test tray.

Preferably, the spacing between the rows of the placing compartments of the test tray is a spacing between odd rows of the placing compartments of the test tray and a spacing between even rows of the placing compartments of the test tray.

Preferably, in the step (a2), more regulating a pitch between columns of the pickers to a spacing between columns of the placing compartments of the test tray.

Preferably, in the step (a1), the picking is performed in such a way that the 1st row of the pickers pick up the semiconductor devices from the customer tray at a different point in time to when the pickers of at least one of other remaining rows pick up the semiconductor devices from the customer tray.

Preferably, the step (a1) includes the steps of (a11) picking up the semiconductor devices from the customer tray by the 1st and 3rd rows of the pickers or the 2nd and 4th rows of the pickers, and (a12) picking up the semiconductor devices from the customer tray by the 2nd and 4th rows of the pickers or the 1st and 3rd rows of the pickers.

In accordance with another exemplary embodiment of the present invention, the present invention can be accomplished by an operation method of a test handler, the method comprising the steps of (a) loading semiconductor devices from a customer tray located on a loading plate onto a test tray located at a loading position, (b) assisting a tester to test the semiconductor devices, loaded onto the test tray, at a test position, after moving the test tray to the test position, and (c) unloading the tested semiconductor devices from the test tray located at an unloading position onto another customer tray located on an unloading plate, after moving the test tray to the unloading position.

Here, the step (c) includes the steps of (c1) picking up the semiconductor devices from the test tray by a sorting pick-and-place apparatus having pickers arrayed in a 2×N matrix (n is an integer), in which a pitch between the 1st and 2nd rows of the pickers is fixed to be identical to a spacing between rows of placing compartments of the test tray and a pitch between columns of the pickers is regulated to be identical to a spacing between columns of the placing compartments of the test tray and a spacing between columns of the loading compartments of the customer tray, (c2) regulating the pitch between the columns of the pickers of the sorting pick-and-place apparatus to the spacing between the columns of the loading compartments of the customer tray, (c3) moving, sorting, and placing the semiconductor devices onto a sorting table having sorting-placing compartments, according to the test result of the tester, in which a spacing between odd rows of the sorting-placing compartments and a spacing between even rows of the sorting-placing compartments are identical to the spacing between the rows of the placing compartments of the test tray and a spacing between columns of the sorting-placing compartments is identical to the spacing between the columns of the loading compartments of the customer tray, and (c4) moving and placing the semiconductor devices from the sorting table onto the customer tray by an unloading pick-and-place apparatus.

Preferably, the step (c4) includes the steps of (c41) picking up the semiconductor devices from the sorting table by the unloading pick-and-place apparatus having pickers arrayed in a 3×N matrix, in which a pitch between the rows of the pickers is regulated to be identical to a spacing between the rows of the sorting-placing compartments of the sorting table and a spacing between rows of the loading compartments of the customer tray, (c42) regulating the pitch between the rows of the pickers of the unloading pick-and-place apparatus to the spacing between the rows of the loading compartments of the customer tray, and (c43) moving and placing the semiconductor devices onto the customer tray.

In accordance with another exemplary embodiment of the present invention, the present invention can be accomplished by a method for loading semiconductor devices in a test handler, wherein a pick-and-place apparatus comprising pickers, arrayed in an M×N matrix (M is an integer equal to or greater than 3 and N is an integer equal to or greater than 1), picks up semiconductor devices from a customer tray in the M×N matrix, regulates a pitch between the 1st and 3rd rows of adjacent three rows of the pickers to a spacing between rows of placing compartments of a test tray, places the semiconductor devices picked up by the 1st and 3rd rows of the pickers or the 2nd row of the pickers onto the test tray, moves a certain distance, and places the semiconductor devices picked up by the 2nd row of the pickers or the 1st and 3rd rows of the pickers onto the test tray.

Preferably, the spacing between the rows of the placing compartments of the test tray is an adjacent inter-row spacing between the placing compartments of the test tray.

Preferably, the spacing between the rows of the placing compartments of the test tray is a spacing between odd rows of the placing compartments of the test tray and a spacing between even rows of the placing compartments of the test tray.

In accordance with another exemplary embodiment of the present invention, the present invention can be accomplished by a method for moving and placing semiconductor devices in a test handler. The method comprises moving and placing semiconductor devices from a first loading element having first loading compartments arrayed in a matrix onto a second loading element having second loading compartments arrayed in a matrix.

Here, a pick-and-place apparatus picks up the semiconductor devices from the first loading compartments of the first loading element and places them selectively onto a plurality of adjacent odd rows or a plurality of adjacent even rows of the second loading compartments of the second loading element, during one moving and placing operation.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspect, features and advantages of certain exemplary embodiments of the present invention will be more apparent from the following detailed description taken in conjunction with the accompanying drawings, in which:

FIG. 1 is a plan view illustrating a general customer tray;

FIG. 2 and FIG. 3 are plan views illustrating a general test tray;

FIG. 4 is a schematic plan view illustrating a test handler adapted to an operation method according to the present invention;

FIG. 5 is a schematic plan view illustrating a loading pick-and-place apparatus adapted to an operation method according to the present invention;

FIG. 6 is a front view illustrating a pair of pickers forming a module, adapted to the loading pick-and-place apparatus of FIG. 5;

FIG. 7A illustrates views which detail the operation of the loading pick-and-place apparatus of FIG. 5;

FIG. 7B to FIG. 7E illustrate views which detail the operations of the loading pick-and-place apparatuses according to other embodiments of the present invention;

FIG. 8 is a schematic plan view illustrating a sorting pick-and-place apparatus adapted to an operation method according to the present invention;

FIG. 9 is a schematic plan view illustrating an unloading pick-and-place apparatus adapted to an operation method according to the present invention;

FIG. 10 is a plan view illustrating a sorting table adapted to an operation method according to the present invention;

FIG. 11 illustrates views to explain the operation of the sorting pick-and-place apparatus of FIG. 8;

FIG. 12 illustrates views to explain the operation of the unloading pick-and-place apparatus of FIG. 9;

FIG. 13A and FIG. 13B, and FIG. 14 to FIG. 16 illustrate views to explain the loading sequence when the semiconductor devices are loaded onto the test trays of FIG. 2 and FIG. 3, respectively; and FIG. 17 is a front view illustrating a pair of pickers forming a module, adapted to the loading pick-and-place apparatus of FIG. 5, according to another embodiment of the present invention.

Throughout the drawings, like reference numerals will be understood to refer to like parts, components and structures.

DETAILED DESCRIPTION OF EXEMPLARY EMBODIMENTS

Hereinafter, exemplary embodiments of the present invention are described in detail with reference to the accompanying drawings. The same reference numbers are used throughout the drawings to refer to the same or similar parts. Detailed descriptions of well-known functions and structures incorporated herein may be omitted to avoid obscuring the subject matter of the present invention.

FIG. 4 is a schematic plan view illustrating a test handler adapted to loading and unloading methods according to an embodiment of the present invention.

As shown in FIG. 4, in the test handler, a test tray (T.T) moves along the circulation path: starting from a loading position (LP), a soak chamber 410, a test chamber 420 which includes a test position (TP), a de-soak chamber 430, an unloading position (UP), and then back to the loading position (LP).

As is known in this field, the soak chamber 410 has a temperature controlled environment for pre-heating/pre-cooling the semiconductor devices loaded onto the test tray (T.T). The test chamber 420 is where the tester tests the semiconductor devices loaded onto the test tray (T.T) at the test position (TP). The de-soak chamber 430 receives the semiconductor devices loaded onto the test tray (T.T), which are tested in and transferred from the test chamber 420, and restores the heated/cooled semiconductor devices to room temperature.

The test handler includes two loading plates 441 and a buffer 442, as shown in FIG. 4, and a loading pick-and-place apparatus 500, as shown in FIG. 5, in order to load the semiconductor devices onto the test tray (T.T) located at the loading position (LP).

Customer trays (C.T), on which untested semiconductor devices are loaded, are located on the two loading plates 441.

The buffer 442 is optional mechanism for the test handler. The buffer 442 serves to correctly arrange semiconductor devices picked up by the loading pick-and-place apparatus 500 or to temporarily receive semiconductor devices that are unsuitable for loading.

As shown in FIG. 5, the loading pick-and-place apparatus 500 includes pickers (PK) arrayed in a 4×8 matrix, which moves the semiconductor devices from the customer tray (C.T), located on the loading plate 441, onto the test tray (T.T), located at the loading position (LP).

As shown in FIG. 5, the loading pick-and-place apparatus 500 is configured in such a way that the pickers (PK1 and PK2) at the 1st and 2nd rows and the pickers (PK3 and PK4) at the 3rd and 4th rows are integrally formed as modules, respectively. That is, a pitch between the 1st row of the picker (PK1) and the 2nd row of the picker (PK2) and a pitch between the 3rd row of the picker (PK3) and the 4th row of the picker (PK4) are fixed to match with a spacing (ac) between the rows of the loading compartments (CS) in the customer tray (C.T). As shown in FIG. 6, the two pickers (PK1 and PK2) are integrally formed as a module (or a block) and are independently moved up and down by respective cylinder piston units (CY). That is, the two pickers (PK1 and PK2) can pick up or release the semiconductor devices, independently and respectively.

As shown in top and bottom figures (a) and (b) of FIG. 7A, a pitch between the columns of the pickers (PK) (which is also referred to as an inter-column pitch between the pickers) can be regulated to a spacing (bc) between the columns (which is also referred to as an inter-column spacing (bc)) of the loading compartments (CS) of the customer tray (C.T) and a spacing (bT) between the columns (which is also referred to as an inter-column spacing (bT)) of the placing compartments (TS) of the test tray (T.T). Also, a pitch between the 1st and the 2nd rows of the pickers (PK1 and PK2), in which the pickers (PK1 and PK2) form a module, and the 3rd and the 4th rows of the pickers (PK3 and PK4), in which the pickers (PK3 and PK4) form a module, can be regulated. That is, the pitch between the 2nd row of the picker (PK2) and the 3rd row of the picker (PK3) can be regulated.

As shown in top and bottom figures (a) and (b) of FIG. 7A, when the pitch between the 2nd row of the picker (PK2) and the 3rd row of the picker (PK3) is decreased, an inter-row pitches between the pickers (PK) are all regulated to match with an inter-row spacing (ac) between the loading compartments (CS) of the customer tray (C.T). On the contrary, when the pitch between the 2nd row of the picker (PK2) and the 3rd row of the picker (PK3) is increased, a pitch between the 1st row of the picker (PK1) and the 3rd row of the picker (PK3) (i.e., the pitch between odd row pickers) and a pitch between the 2nd row of the picker (PK2) and the 4th row of the picker (PK4) (i.e., the pitch between even row pickers) are regulated to match with the inter-odd-row spacing (G1) between the placing compartments (TS) of the test tray (T.T) as shown in FIG. 2 (or the inter-odd-row spacing (G2) for the test tray (T.T) as shown in FIG. 3) and the inter-even-row spacing (G1) between the placing compartments (TS) of test tray (T.T) as shown in FIG. 2 (or the inter-odd-row spacing (G2) for the test tray (T.T) as shown in FIG. 3).

FIG. 7B to FIG. 7E illustrate views to explain the operations of the loading pick-and-place apparatuses (500', 500", 500''', and 500'''') according to other embodiments of the present invention.

Similar to the configuration of FIG. 5, as shown in FIG. 7B, the loading pick-and-place apparatus 500' is configured in such a way that an inter-column pitch between the pickers (PK) can be selectively regulated to the inter-column spacing (bc) between the loading compartments (CS) of the customer tray (C.T) and an inter-column spacing (bT) between the placing compartments (TS) of the test tray (T.T). Also, a pitch between the 1st and the 2nd rows of the pickers (PK1 and PK2), in which the pickers (PK1 and PK2) form a module, and a pitch between the 3rd and the 4th rows of the pickers (PK3 and PK4), in which the pickers (PK3 and PK4) form a module, can be regulated. That is, the pitch between the 2nd row of the picker (PK2) and the 3rd row of the picker (PK3) can be regulated.

As shown in top and bottom figures (a) and (b) of FIG. 7B, when the pitch between the 2nd row of the picker (PK2) and the 3rd row of the picker (PK3) is decreased, an inter-row pitches between the pickers (PK) are all regulated to match with an inter-row spacing (ac) between the loading compartments (CS) of the customer tray (C.T). On the contrary, when the pitch between the 2nd row of the picker (PK2) and the 3rd row of the picker (PK3) is increased, a pitch between the 1st row of the picker (PK1) and the 3rd row of the picker (PK3) (i.e., the pitch between odd row pickers) and a pitch between the 2nd row of the picker (PK2) and the 4th row of the picker (PK4) (i.e., the pitch between even row pickers) are regulated to match the inter-row spacing (aT) between the adjacent rows of the placing compartments (TS) in the test tray (T.T) as shown in FIG. 2 (or the inter-row spacing (aT1) for the test tray as shown in FIG. 3).

FIG. 7C and FIG. 7D illustrate pick-and-place apparatuses 500" and 500''', according to other embodiments of the present invention, which are implemented to include pickers arrayed in four or more rows. In these apparatuses, four adjacent rows of the pickers are arrayed so that a pitch between the 1st and 2nd rows of the pickers and a pitch between the 3rd and 4th rows of the pickers are fixed and then a pitch between the 2nd and 3rd rows of the pickers is regulated. Also, the pick-and-place apparatuses 500" and 500''' may include additional pickers to the pickers arrayed in four adjacent rows. Like the pick-and-place apparatuses 500 and 500' as shown in FIG. 7A and FIG. 7B, the pick-and-place apparatuses 500" and 500''' perform a loading operation using the pickers arrayed in four adjacent rows. Although FIG. 7C and FIG. 7D illustrate the loading pick-and-place apparatuses 500" and 500''' where the pitches between the pickers, which arrayed in other rows other than the four adjacent rows, are not regulated, it should be understood that the apparatuses could be implemented so that the pitches can also be regulated.

FIG. 7E illustrates a pick-and-place apparatus 500'''', according to another embodiment of the present invention, which is implemented to include pickers arrayed in three rows. In this apparatus, a pitch between the 1st and 2nd rows of the pickers is fixed and then a pitch between the 2nd and 3rd rows is regulated. The pick-and-place apparatus 500'''' is operated in such a way that the pickers arrayed in the 1st and 3rd rows load their picked up semiconductor devices onto a test tray and then the pickers arrayed in the 2nd row load their picked up semiconductor devices onto the test tray. Alternately, it should be understood that the pick-and-place apparatus 500'''' may be implemented in such a way that the pickers arrayed in the 2nd row perform the loading operation of the picked up semiconductor devices earlier than the pickers arrayed in the 1st and 3rd rows do.

Referring to FIG. 7B, if the pitches between the odd rows and between the even rows of the loading compartments (CS) in the customer tray (C.T) (i.e., a pitch ($2aC$) which is two times of inter-row pitch (aC) between the loading compartments (CS) in the customer tray (C.T)) are identical to the spacing (aT) between the adjacent rows of the placing compartments (TS) in the test tray (T.T), the pick-and-place apparatus 500' may not require a pitch regulation apparatus that regulates the pitch between the rows of the pickers (PK).

The test handler of FIG. 4 includes six unloading plates 451, a pair of sorting tables 452, a sorting pick-and-place apparatus 800 of FIG. 8, and an unloading pick-and-place apparatus 900 of FIG. 9, in order to unload the semiconductor devices from the test tray (T.T) located at the unloading position (UP).

Empty customer trays (C.T) are located on the unloading plates 451.

The sorting table 452 is installed to move back and forth, and forms sorting-placing compartments (SS) in a matrix, on which semiconductor devices are placed. As shown in FIG. 10, the sorting table 452 is configured in such a way that a spacing between the columns of the sorting-placing compartments (SS) is identical to the inter-column spacing (bC) between the loading compartments (CS) in the customer tray (C.T), and a spacing between the odd rows and between the even rows of the sorting-placing compartments (SS) is identical to the inter-row spacing (aT/aT1) between the placing compartments (TS) in the test tray (T.T).

As shown in FIG. 8, the sorting pick-and-place apparatus 800 includes pickers (PK) arrayed in a 2×8 matrix. Referring to FIG. 11, an inter-column pitch between the pickers (PK) can be selectively regulated to the inter-column spacing (bT) between the placing compartments (TS) of the test tray (T.T) and the inter-column spacing (bC) between the sorting-placing compartments (SS) of the sorting table 452 (the inter-column spacing between the loading compartments of the customer tray). An inter-row pitch between the pickers (PK) is fixed to the inter-row spacing (aT) between the placing compartments (TS) in the test tray (T.T).

As shown in FIG. 9, the unloading pick-and-place apparatus 900 includes pickers (PK) arrayed in a 3×8 matrix. Referring to FIG. 12, an inter-column pitch between the pickers (PK) is identically fixed to the inter-column spacing (bC) between the loading compartments (CS) of the customer tray (C.T). An inter-row pitch between the pickers (PK) can be selectively regulated to the inter-row spacing (as) between the sorting-placing compartments (SS) of the sorting table 452 and the inter-row spacing (ac) between the loading compartments (CS) of the customer tray (C.T).

The following describes in detail the operation of the test handler as configured in the manner described above.

The loading pick-and-place apparatus 500 of FIG. 5 picks up semiconductor devices from a customer tray (C.T) located on the loading plate 441, and then loads them onto a test tray (T.T) located at the loading position (LP).

After loading, the test tray (T.T) is transferred through the soak chamber 410 to the test chamber 420 and then the tester tests the semiconductor devices loaded onto the test tray (T.T) at the test position (TP).

After testing, the test tray (T.T) is transferred, onto which the tested semiconductor devices are loaded, through the de-soak chamber 430 to the unloading position (UP). After that, the sorting pick-and-place apparatus 800 of FIG. 8, the sorting table 452 of FIG. 10, and the unloading pick-and-place apparatus 900 of FIG. 9 are operated to unload the tested semiconductor devices from the test tray (T.T) onto customer trays (C.T) located on the unloading plate 451.

The following is a detailed description of the loading and unloading methods according to the present invention.

Example 1 for Loading

1. To pick up semiconductor devices

The loading pick-and-place apparatus 500 picks up semiconductor devices from the customer tray (C.T) located on the loading plate 441. The inter-row pitch and the inter-column pitch between the pickers (PK) of the loading pick-and-place apparatus 500 are identical to the inter-row spacing (aC) and inter-column spacing (bC) between the loading compartments (CS) of the customer tray (C.T), as shown in top figure (a) of FIG. 7A.

2. To regulate pitch

After the semiconductor devices are picked up in a 4×8 matrix from the customer tray (C.T) located on the loading plate 441, the pitch between the 2nd row of the pickers (PK2) and the 3rd row of the pickers (PK3) is regulated as shown in bottom figure (b) of FIG. 7A, so that the inter-odd-row pitch between the pickers (PK1 and PK3) and the inter-even-row pitch between the pickers (PK2 and PK4) are regulated to be identical to the inter-odd-row spacing (G1/G2) and the inter-even-row spacing (G1/G2) between the placing compartments (TS) of the test tray (T.T), and the inter-column pitch between the pickers (PK) is also regulated so as to be identical to the inter-column spacing (bT) between the placing compartments (TS) of the test tray (T.T).

If the above process is conducted by the loading pick-and-place apparatus 500' of FIG. 7B, the pitches between the pickers are regulated as follows. As shown in bottom figure (b) of FIG. 7B, when the pitch between the 2nd row of the pickers (PK2) and the 3rd row of the pickers (PK3) is regulated, the pitch between odd rows of the pickers (PK1 and PK3) and the pitch between even rows of the pickers (PK2 and PK4) are regulated so as to be identical to the inter-row spacing (aT/aT1) between the adjacent rows of the placing compartments (TS) of the test tray (T.T).

Referring to FIG. 7B, if the spacing between the odd rows and between the even rows of the loading compartments (CS) in the customer tray (C.T) (i.e., a spacing (2ac) which is two times of inter-row spacing (ac) between the loading compartments (CS) in the customer tray (C.T)) are identical to the spacing (aT/aT1) between the adjacent rows of the placing compartments (TS) in the test tray (T.T), the loading pick-and-place apparatus 500' does not require a pitch regulating operation between the rows of the pickers (PK).

3. To align

The loading pick-and-place apparatus 500 moves to the buffer 442 and aligns the semiconductor devices which are misaligned in regulating pitch. According to a modification, the loading pick-and-place apparatus 500 may further place semiconductor devices, which are unsuitable for the test, in a storing area prepared at the left of the buffer 442.

4. To load

After aligning the semiconductor devices at the buffer 442, the loading pick-and-place apparatus 500 moves above the test tray (T.T) located at the loading position (LP) and allows the 1st and 3rd rows of the pickers (PK) to place their picked up semiconductor devices onto the 1st and 3rd rows of the placing compartments (TS) of the test tray (T.T), as shown in FIG. 13A and FIG. 15. After that, the loading pick-and-place apparatus 500 moves a certain distance (i.e., aT−ac/aT1−ac) and then allows the 2nd and 4th rows of the pickers (PK) to place their picked up semiconductor devices onto the 2nd and 4th rows of the placing compartments (TS) of the test tray (T.T).

If the above process is conducted by the loading pick-and-place apparatus 500' of FIG. 7B, the loading pick-and-place apparatus 500' places the semiconductor devices, picked up by the 1st and 3rd rows of the pickers (PK), onto the 1st and 2nd rows of the placing compartments (TS) of the test tray (T.T) and then moves a certain distance (G1−ac=2aT−ac) to places the semiconductor devices, picked up by the 2nd and 4th rows of the pickers (PK), onto the 3rd and 4th rows of the placing compartments (TS) of the test tray (T.T). When this embodiment uses the test tray (T.T) of FIG. 3, the loading pick-and-place apparatus 500' places the semiconductor devices on the 1st and 2nd rows of the placing compartments (TS) of test tray (T.T) and will then move the distance (G2−ac=aT1+aT2−ac).

If the above process is conducted by the pick-and-place apparatus 500' of FIG. 7B, the loading pick-and-place apparatus 500' may be operated in such a way that, after loading as shown in FIG. 13B, it moves a certain distance (8bT) towards the right with respect to the drawing, instead of moving down, and then loads the semiconductor devices onto the 1st and 2nd rows of the placing compartments (TS) located at the right of the test tray (T.T).

As such, the loading pick-and-place apparatus 500 repeats steps 1 to 4 described above until semiconductor devices are loaded onto all the placing compartments (TS) of the test tray (T.T).

That is, the pickers (PK1 and PK2) arranged correspondingly in the 1st and 2nd rows form a module (or a block), and similarly, the pickers (PK3 and PK4) arranged correspondingly in the 3rd and 4th rows also form a module. The pickers (PK1, PK2/PK3, PK4) forming modules are independently operated by respective cylinder-piston units (CY). The odd row pickers (PK1 and PK3) and the even row pickers (PK2 and PK4) perform loading operations at different times. Thus, regulating the inter-row pitch of the pickers (PK) can be achieved only by utilizing cylinder piston units instead of a cam system or a link system. Thus, this makes it possible that the pick-and-place apparatus according to the present invention can be configured to include three or more rows of pickers (PK). Compared to the conventional pick-and-place apparatus that performs a loading operation using pickers arrayed in a 2×8 matrix, the pick-and-place apparatus according to the present invention performs the loading operation by pickers arrayed in a 4×8 matrix, for example. Therefore, when loading 32 semiconductor devices, the loading pick-and-place apparatus reduces its total movement distance and thus increases its loading speed.

Example 2 for Loading

As shown in FIG. 6, the loading pick-and-place apparatus 500 according to an embodiment of the present invention includes the pickers (PK1 and PK2) arranged correspondingly in the 1st and 2nd rows, which form a module and are independently moved up and down by respective cylinder piston units (CY). Alternatively, as shown in FIG. 17, the embodiment may be implemented in such a way that a cylinder piston unit is installed to only one of the 1st and the 2nd row of the picker (PK1 and PK2), for example, in the case that the cylinder piston unit is installed to only the 1st row of the picker (PK1), this regulates: the upper ascending point of the 1st row of the picker (PK1) to a point higher than a point of the 2nd row of the picker (PK2); and the lower descending point of the 1st row of the picker (PK1) to a point lower than the point of the 2nd row of the picker (PK2). The differences between example 1 and example 2 are explained below.

1. To pick up semiconductor devices

In this embodiment according to the present invention, the loading pick-and-place apparatus 500 is implemented in such a way that the 1st row of the picker (PK1) and the 2nd row of the picker (PK2) are not positioned at the same height. Therefore, cylinder piston units operate to lower the 1st row of the pickers (PK1), so that the 1st row of the pickers (PK1) can pick up semiconductor devices, and then the cylinder piston units lift the 1st row of the pickers (PK1). After that, the loading pick-and-place apparatus 500 lowers to half the operation distance of the 1st row of the pickers (PK1) by the cylinder piston units to allow the 2nd row of the pickers (PK2) to pick up the semiconductor devices. Compared to example 1 where the pickers perform the picking up simultaneously, the present embodiment shows that the picking up of the odd-row pickers (PK1 and PK3) and the picking up of the even-row pickers (PK2 and PK4) are performed at different times.

2. To regulate pitch

Pitch regulation of the present embodiment is the same as that of example 1.

3. To align

Similar to the method of picking up semiconductor devices as described in item 1 of example 2, the 1st row of the picker (PK1) and the 2nd row of the picker (PK2) perform the aligning operation at different times.

4. To load

Compared to example 1 where corresponding cylinder piston units (CY) operate to allow pickers (PK) associated therewith to perform a loading operation, the present embodiment shows that only the cylinder piston units of the 1st row of the picker (PK1) operate. When the 1st row of the pickers (PK1) performs a loading operation, they are lowered. On the contrary, when the 2nd row of the picker (PK2) performs a loading operation, the 1st row of the picker (PK1) is lifted. Specifically, the 2nd row of the picker (PK2) performs the loading operation as the pick-and-place apparatus 500 is lowered.

According to this embodiment, the number of cylinder piston units can be reduced and accordingly the number of parts for generating vacuum pressure associated with the cylinder piston units is also decreased, thereby reducing the weight and manufacturing cost of the loading pick-and-place apparatus 500.

Example of Unloading Method

1. To pick up semiconductor devices

The sorting pick-and-place apparatus 800 picks up semiconductor devices loaded onto the test tray (T.T) located at the unloading position (UP). Specifically, as shown in bottom figure (b) of FIG. 11, the inter-column pitch between the pickers of the sorting pick-and-place apparatus 800 is identical to the inter-column spacing (bT) between the placing compartments (TS) of the test tray (T.T).

2. To regulate pitch

As shown in top figure (a) of FIG. 11, the sorting pick-and-place apparatus 800 regulates the inter-column pitch between the pickers (PK) that pick up semiconductor devices to the inter-column spacing (bC) between the sorting-placing compartments (SS) of the sorting table 452 (the inter-column spacing between the loading compartments of the customer tray).

3. To place

The sorting pick-and-place apparatus 800 sorts and places the picked up semiconductor devices onto two odd rows or two even rows of the sorting-placing compartments (SS) in the sorting table 452, according to the test result produced by the tester.

4. To pick up semiconductor devices

When a certain number of semiconductor devices are placed onto the sorting table 452, the unloading pick-and-place apparatus 900 operates in order to pick them up from the sorting table 452. As shown in bottom figure (b) of FIG. 12, the inter-row pitch between the pickers (PK) of the unloading pick-and-place apparatus 900 is regulated to be identical to the inter-row spacing (aS) between the sorting-placing compartments (SS) in the sorting table 452.

5. To regulate pitch

As shown in top figure (a) of FIG. 12, when the unloading pick-and-place apparatus 900 regulates the inter-row pitch between the pickers (PK) to the inter-row spacing (aC) between the loading compartments (CS) of the customer tray (C.T).

6. To unload

The unloading pick-and-place apparatus 900 moves to the customer tray (C.T) located on the unloading plate 451 and unloads the picked up semiconductor devices onto the customer tray (C.T).

Although the drawings for this embodiment show the inter-row spacing (aC) between the loading compartments (CS) of the customer tray (C.T) as smaller than the inter-row spacing (aS) between the sorting-placing compartments (SS) of the sorting table 452 (aC<aS), it should be understood that the present embodiment can be modified so that the inter-row spacing (aC) between the loading compartments (CS) of the customer tray (C.T) is greater than the inter-row spacing (aS) between the sorting-placing compartments (SS) of the sorting table 452 (aC>aS), according to the type of semiconductor device.

As described above, the present invention can reduce the loading time and unloading time by employing the following technique:

When the loading pick-and-place apparatus picks up and loads semiconductor devices from a customer tray (C.T) onto a test tray (T.T) using its pickers (PK) arrayed in a 4×8 matrix, it: regulates the pitch between the adjacent odd rows of the pickers (PK1 and PK3) and the pitch between the adjacent even rows of the pickers (PK2 and PK4) to the inter-odd-row spacing and inter-even-row spacing (G1/G2) between the placing compartments (TS) of the test tray (T.T); loads the semiconductor devices from the odd-row pickers (PK1 and PK3) or the even-row pickers (PK2 and PK4) onto the test tray (T.T); and moves a certain distance (aT−aC/aT1−aC) to load the remaining semiconductor devices, not yet unloaded, from the even-row pickers (PK2 and PK4) or the odd-row pickers (PK1 and PK3) onto the test tray (T.T). That is, since the pick-and-place apparatus is configured such that the pickers (PK1 and PK2) of the 1st and 2nd rows can be formed as a module and the pickers (PK3 and PK4) of the 3rd and 4th rows can be also formed as a module, the pitch regulation apparatus becomes simple. Therefore, since the loading pick-and-place apparatus 500 utilizes only cylinder piston units to regulate the pitch between the rows of the pickers (PK) thereof, although the number of the pickers (PK) is increased, its weight will increase only in proportion to an increment of the number of the pickers (PK). The pick-and-place apparatus of the present invention can be implemented to minimize its weight increment and pick up a relatively large number of semiconductor devices during one operation, thereby reducing the loading time.

When semiconductor devices are moved and placed from the first loading compartments arrayed in a matrix on a first loading element (referred to as a customer tray when loading and a test tray when unloading, referring to the embodiments of the present invention) onto the second loading compartments arrayed in a matrix on a second loading element (referred to as a test tray when loading and a sorting table when unloading, referring to the embodiments of the present invention), the pickers of the pick-and-place apparatus according to the present invention pick up the semiconductor devices from the first loading compartments and then place them on the adjacent two odd rows or the adjacent two even rows of the second loading compartments, during one moving/placing operation.

As described above, in order to perform a loading operation, without the use of the cam or link systems which are heavy and complicated, the loading pick-and-place apparatus of the present invention can increase the number of the pickers and thus reduce the loading time. Similar to the principle or procedure of the loading method, the unloading method perform the unloading operation. Also, these loading and unloading methods can be combined and implemented in an apparatus.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined in the appended claims their equivalents.

What is claimed is:

1. An operation method of a test handler, the method comprising the steps of:
   (a) loading semiconductor devices from a customer tray located on a loading plate onto a test tray located at a loading position by a loading pick-and-place apparatus having pickers arrayed in an M×N matrix (M is an integer equal to or greater than 4 and N is an integer equal to or greater than 1), in which, in terms of adjacent four rows, a pitch between the 1st and 2nd rows of the pickers and a pitch between the 3rd and 4th rows of the pickers are fixed to be identical to a spacing between rows of loading compartments of the customer tray;
   (b) assisting a tester to test the semiconductor devices, loaded onto the test tray, at a test position, after moving the test tray to the test position; and
   (c) unloading the tested semiconductor devices from the test tray located at an unloading position onto another customer tray located on an unloading plate, after moving the test tray to the unloading position,
   wherein the step (a) includes the steps of:
   (a1) picking up the semiconductor devices from the customer tray by the pickers;
   (a2) regulating a pitch between the 2nd and 3rd rows of the pickers so that a pitch between the 1st and 3rd rows of the pickers and a pitch between the 2nd and 4th rows of the pickers are identical to a spacing between rows of placing compartments of the test tray; and
   (a3) placing the semiconductor devices, picked up by the 1st and 3rd rows of the pickers or the 2nd and 4th rows of the pickers, moving a certain distance, and placing the remaining semiconductor devices, picked up by the 2nd and 4th rows of the pickers or the 1st and 3rd rows of the pickers.

2. The operation method of claim 1, wherein the spacing between the rows of the placing compartments of the test tray is an adjacent inter-row spacing between the placing compartments of the test tray.

3. The operation method of claim 1, wherein the spacing between the rows of the placing compartments of the test tray is a spacing between odd rows of the placing compartments of the test tray and a spacing between even rows of the placing compartments of the test tray.

4. The operation method of claim 1, wherein in the step (a2), more regulating a pitch between columns of the pickers to a spacing between columns of the placing compartments of the test tray.

5. The operation method of claim 1, wherein in the step (a1), the picking is performed in such a way that the 1st row of the pickers pick up the semiconductor devices from the customer tray at a different point in time to when the pickers of at least one of other remaining rows pick up the semiconductor devices from the customer tray.

6. The operation method of claim 5, wherein the step (a1) includes the steps of:
   (a11) picking up the semiconductor devices from the customer tray by the 1st and 3rd rows of the pickers or the 2nd and 4th rows of the pickers; and
   (a12) picking up the semiconductor devices from the customer tray by the 2nd and 4th rows of the pickers or the 1st and 3rd rows of the pickers.

7. An operation method of a test handler, the method comprising the steps of:
   (a) loading semiconductor devices from a customer tray located on a loading plate onto a test tray located at a loading position;
   (b) assisting a tester to test the semiconductor devices, loaded onto the test tray, at a test position, after moving the test tray to the test position; and
   (c) unloading the tested semiconductor devices from the test tray located at an unloading position onto another customer tray located on an unloading plate, after moving the test tray to the unloading position,
   wherein the step (c) includes the steps of:
   (c1) picking up the semiconductor devices from the test tray by a sorting pick-and-place apparatus having pickers arrayed in a 2×N matrix (n is an integer), in which a pitch between the 1st and 2nd rows of the pickers is fixed to be identical to a spacing between rows of placing compartments of the test tray and a pitch between columns of the pickers is regulated to be identical to a spacing between columns of the placing compartments of the test tray and a spacing between columns of the loading compartments of the customer tray;

(c2) regulating the pitch between the columns of the pickers of the sorting pick-and-place apparatus to the spacing between the columns of the loading compartments of the customer tray;

(c3) moving, sorting, and placing the semiconductor devices onto a sorting table having sorting-placing compartments, according to the test result of the tester, in which a spacing between odd rows of the sorting-placing compartments and a spacing between even rows of the sorting-placing compartments are identical to the spacing between the rows of the placing compartments of the test tray and a spacing between columns of the sorting-placing compartments is identical to the spacing between the columns of the loading compartments of the customer tray; and (c4) moving and placing the semiconductor devices from the sorting table onto the customer tray by an unloading pick-and-place apparatus.

8. The operation method of claim 7, wherein the step (c4) includes the steps of:

(c41) picking up the semiconductor devices from the sorting table by the unloading pick-and-place apparatus having pickers arrayed in a 3×N matrix, in which a pitch between the rows of the pickers is regulated to be identical to a spacing between the rows of the sorting-placing compartments of the sorting table and a spacing between rows of the loading compartments of the customer tray;

(c42) regulating the pitch between the rows of the pickers of the unloading pick-and-place apparatus to the spacing between the rows of the loading compartments of the customer tray; and (c43) moving and placing the semiconductor devices onto the customer tray.

* * * * *